US012658549B2

(12) United States Patent
Ikemoto et al.

(10) Patent No.: US 12,658,549 B2
(45) Date of Patent: Jun. 16, 2026

(54) MULTILAYER SUBSTRATE AND ELECTRONIC DEVICE

(71) Applicant: Murata Manufacturing Co., Ltd., Nagaokakyo (JP)

(72) Inventors: Nobuo Ikemoto, Nagaokakyo (JP); Masanori Okamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 338 days.

(21) Appl. No.: 18/223,075

(22) Filed: Jul. 18, 2023

(65) Prior Publication Data

US 2024/0055745 A1 Feb. 15, 2024

(30) Foreign Application Priority Data

Aug. 10, 2022 (JP) ................................. 2022-127682
May 16, 2023 (JP) ................................. 2023-080793

(51) Int. Cl.
| | |
|---|---|
| *H01P 3/08* | (2006.01) |
| *H01P 3/12* | (2006.01) |
| *H05K 1/02* | (2006.01) |
| *H05K 1/05* | (2006.01) |
| *H05K 1/09* | (2006.01) |
| *H05K 1/14* | (2006.01) |

(52) U.S. Cl.
CPC ................ *H01P 3/088* (2013.01); *H01P 3/12* (2013.01); *H05K 1/028* (2013.01); *H05K 1/05* (2013.01);

(Continued)

(58) Field of Classification Search
CPC . H01P 3/088; H01P 3/12; H01P 3/087; H05K 1/028; H05K 1/05; H05K 1/09;

(Continued)

(56) References Cited

U.S. PATENT DOCUMENTS

| | | | |
|---|---|---|---|
| 6,518,864 B1 | 2/2003 | Ito et al. | |
| 6,992,420 B2 * | 1/2006 | Jang ....................... | H03H 9/173 |
| | | | 310/341 |

(Continued)

FOREIGN PATENT DOCUMENTS

| | | |
|---|---|---|
| JP | 09-186466 A | 7/1997 |
| JP | 2000-269707 A | 9/2000 |

(Continued)

*Primary Examiner* — John W Poos
(74) *Attorney, Agent, or Firm* — Keating & Bennett, LLP

(57) ABSTRACT

A multilayer substrate includes a multilayer body including resin layers stacked in a Z-axis direction, a signal conductor layer, and one or more through conductors passing through a first resin layer in the Z-axis direction. A first main surface of the first resin layer includes one or more hollow portions not in contact with the signal conductor layer and overlapping the signal conductor layer when viewed in the Z-axis direction. Each of the one or more hollow portions and the one or more through conductors includes a tapered region in which each of a cross-sectional area of the one or more hollow portions orthogonal to the Z-axis direction and a cross-sectional area of the one or more through conductors orthogonal to the Z-axis direction increases toward the first main surface. The tapered region is in contact with the first main surface of the first resin layer.

21 Claims, 33 Drawing Sheets

10

(52) U.S. Cl.
CPC .............. H05K 1/09 (2013.01); H05K 1/144
(2013.01); *H05K 2201/095* (2013.01)

(58) Field of Classification Search
CPC ............. H05K 1/144; H05K 2201/095; H05K
2201/0129; H05K 2201/09063; H05K
2201/09827; H05K 1/0219; H03H 9/059;
H03H 9/1092; H03H 9/02834; H03H
9/1071; H03H 3/08; H03H 9/02897;
H03H 9/145; H03H 9/25; H03H 9/64;
H03H 2218/12; H03H 9/02015; H03H
9/02559; H03H 9/02574; H03H 9/02629;
H03H 9/02866; H03H 9/02992; H03H
9/0542; H03H 9/0547; H03H 9/0552;
H03H 9/0576; H03H 9/1021; H03H
9/1042; H03H 9/1085; H03H 9/6483;
H03H 9/6489; H03H 9/72
See application file for complete search history.

(56) References Cited

U.S. PATENT DOCUMENTS

| | | | | |
|---|---|---|---|---|
| 9,270,252 | B2 * | 2/2016 | Nishii .................. | H03H 9/6433 |
| 2008/0149379 | A1 | 6/2008 | Nagase et al. | |
| 2009/0322186 | A1 * | 12/2009 | Iwashita ........... | H03H 9/02086 |
| | | | | 310/348 |
| 2010/0052473 | A1 * | 3/2010 | Kimura ................. | H03H 9/059 |
| | | | | 29/25.35 |
| 2017/0273183 | A1 * | 9/2017 | Kawasaki ............... | H03H 3/08 |
| 2018/0241370 | A1 * | 8/2018 | Sekiya ................... | H01L 24/13 |
| 2022/0200116 | A1 | 6/2022 | Ikemoto | |

FOREIGN PATENT DOCUMENTS

| | | |
|---|---|---|
| JP | 2008-159818 A | 7/2008 |
| JP | 2012-019278 A | 1/2012 |
| WO | 2020/179476 A1 | 9/2020 |
| WO | 2021/095620 A1 | 5/2021 |

* cited by examiner

10

Sa:S1-S3
Sb:S4-S6

10c

10c

U

B ←→ F    ⊚ ⊗

D         R  L

10d

10h

10k

10n

U
↑
B ←→ F    ◎ ⊗
↓         R  L
D

10o

10p

MULTILAYER SUBSTRATE AND ELECTRONIC DEVICE

CROSS REFERENCE TO RELATED APPLICATIONS

This application claims the benefit of priority to Japanese Patent Application No. 2022-127682 filed on Aug. 10, 2022 and Japanese Patent Application No. 2023-080793 filed on May 16, 2023. The entire contents of this application are hereby incorporated herein by reference.

BACKGROUND OF THE INVENTION

1. Field of the Invention

The present invention relates to a multilayer substrate including a signal conductor layer and an electronic device.

2. Description of the Related Art

As an invention related to an existing multilayer substrate, for example, a circuit board described in International Publication No. 2020/179476 has been known. The circuit board includes a dielectric substrate and a line conductor. The line conductor is provided in the dielectric substrate. A space is provided in the dielectric substrate. The space overlaps the line conductor when viewed in an up-down direction. As described above, a dielectric constant around the line conductor is adjusted by providing the space in the dielectric substrate. As a result, characteristic impedance generated in the line conductor is adjusted.

In the circuit board disclosed in International Publication No. 2020/179476, there is a demand for suppressing breakage of the dielectric substrate.

SUMMARY OF THE INVENTION

Preferred embodiments of the present invention provide multilayer substrates and electronic devices each capable of suppressing breakage of a multilayer body.

A multilayer substrate according to a preferred embodiment of the present invention includes a multilayer body including a plurality of resin layers including a first resin layer and stacked in a Z-axis direction, a signal conductor layer in the multilayer body, and one or more through conductors passing through the first resin layer in the Z-axis direction, wherein each of the plurality of resin layers includes a first main surface and a second main surface in the Z-axis direction, the first main surface of the first resin layer includes one or more hollow portions that are not in contact with the signal conductor layer and overlap the signal conductor layer when viewed in the Z-axis direction, the one or more hollow portions do not pass through the first resin layer in the Z-axis direction, each of the one or more hollow portions and the one or more through conductors includes a tapered region in which each of a cross-sectional area of the one or more hollow portions orthogonal to the Z-axis direction and a cross-sectional area of the one or more through conductors orthogonal to the Z-axis direction increases toward the first main surface of the first resin layer in the Z-axis direction, and the tapered region is in contact with the first main surface of the first resin layer.

According to preferred embodiments of the present invention, breakage of the multilayer body is reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is an exploded perspective view of a multilayer substrate 10a.

DETAILED DESCRIPTION OF THE PREFERRED EMBODIMENTS

Preferred Embodiment

Structure of Multilayer Substrate 10

Figure 1:
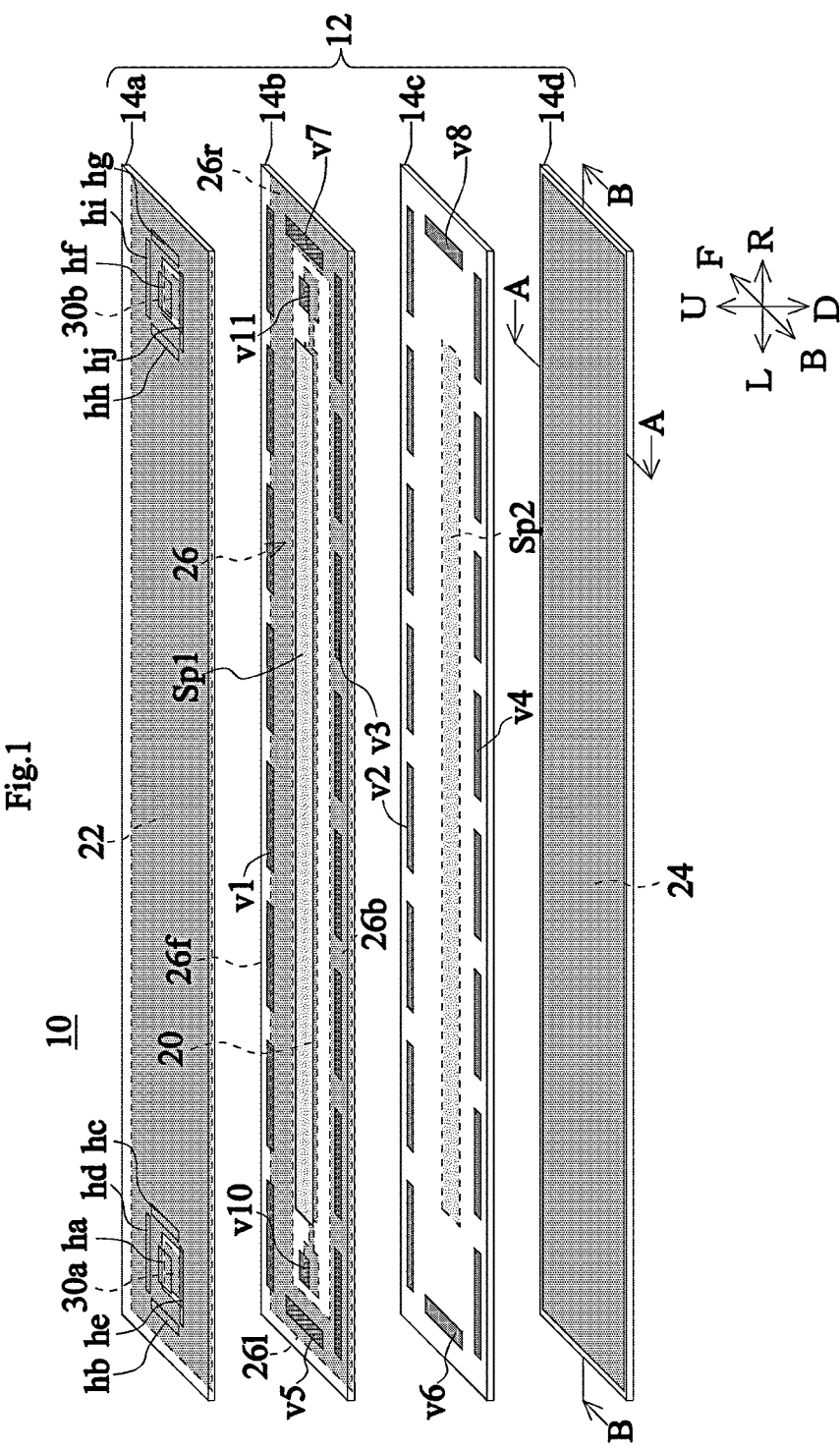
FIG. 1 is an exploded perspective view of a multilayer substrate 10.
Figure 2:
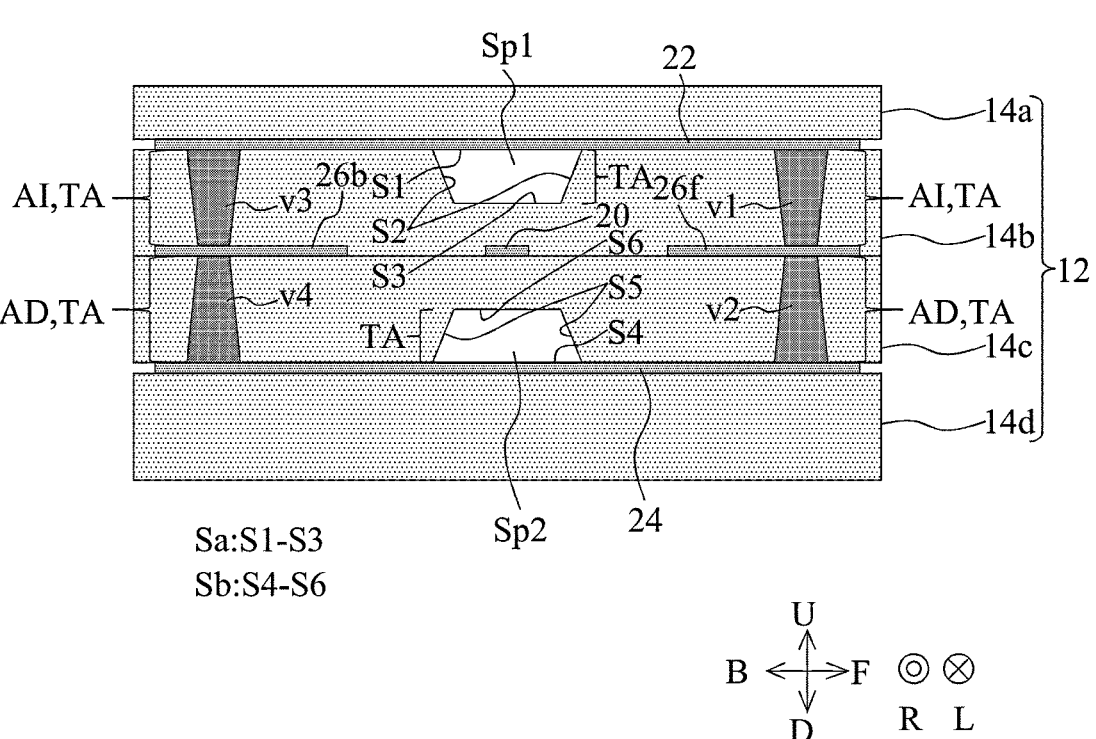
FIG. 2 is a cross-sectional view of the multilayer substrate 10 taken along line A-A.
Figure 3:
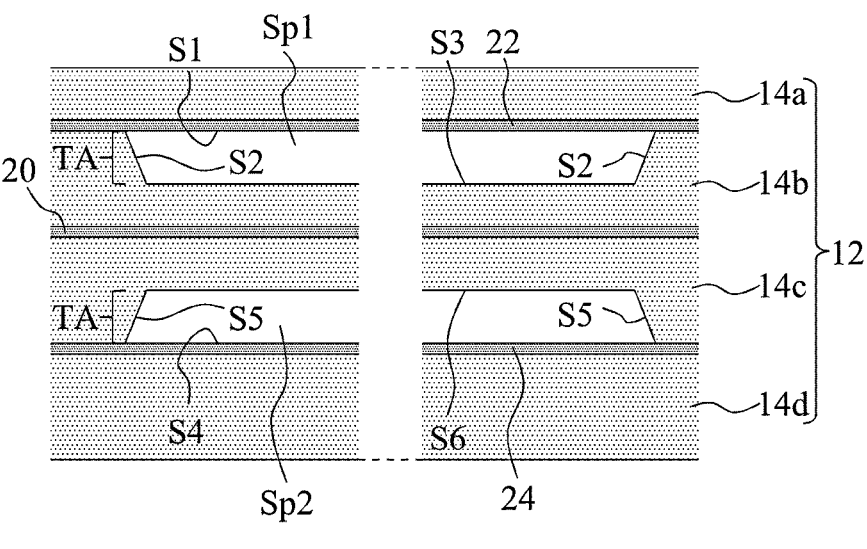
FIG. 3 is a cross-sectional view of the multilayer substrate 10 taken along line B-B.

Hereinafter, a structure of a multilayer substrate 10 according to a preferred embodiment of the present invention will be described with reference to the drawings. FIG. 1 is an exploded perspective view of the multilayer substrate 10. FIG. 2 is a cross-sectional view of the multilayer substrate 10 taken along line A-A. FIG. 3 is a cross-sectional view of the multilayer substrate 10 taken along line B-B. In FIG. 1 and FIG. 2, only representative through conductors v1 to v4 among a plurality of through conductors v1 to v4 are denoted by reference numerals.

In this specification, directions are defined as follows. A stacking direction of a multilayer body 12 of the multilayer substrate 10 is an up-down direction (Z-axis direction). The up-down direction (Z-axis direction) is a thickness direction of the multilayer substrate 10. An upward direction is a positive direction of the Z axis. A downward direction is a negative direction of the Z axis. A direction in which a signal conductor layer 20 of the multilayer substrate 10 extends is a left-right direction (X-axis direction). The left-right direction (X-axis direction) is orthogonal to the up-down direction (Z-axis direction). In addition, a direction orthogonal to the up-down direction (Z-axis direction) and the left-right direction (X-axis direction) is a front-back direction (Y-axis direction). Note that the up-down direction, the front-back direction, and the left-right direction in this specification need not coincide with the up-down direction, the front-back direction, and the left-right direction in actual use of the multilayer substrate 10.

First, the structure of the multilayer substrate 10 will be described with reference to FIG. 1. The multilayer substrate 10 is a high-frequency signal line that transmits a high-frequency signal. The multilayer substrate 10 is used to electrically connect two circuits in an electronic device such as a smartphone. As illustrated in FIG. 1, the multilayer substrate 10 has a strip shape extending in the left-right direction.

As illustrated in FIG. 1, the multilayer substrate 10 includes the multilayer body 12, the signal conductor layer 20, a first ground conductor layer 22, a second ground conductor layer 24, a third ground conductor layer 26, outer electrodes 30*a* and 30*b*, the plurality of through conductors v1, the plurality of through conductors v2, the plurality of through conductors v3, the plurality of through conductors v4, a through conductor v5, a through conductor v6, a through conductor v7, a through conductor v8, a through conductor v10, and a through conductor v11.

As illustrated in FIG. 1, the multilayer body 12 has a strip shape. Therefore, the multilayer body 12 has an upper main surface (positive main surface) and a lower main surface (negative main surface) arranged in this order in the downward direction (the negative direction of the Z axis). In other words, the multilayer body 12 has a first multilayer body main surface and a second multilayer body main surface that are arranged in the up-down direction (Z-axis direction). For example, when the upper main surface (positive main surface) of the multilayer body 12 is referred to as the first multilayer body main surface of the multilayer body 12, the lower main surface (negative main surface) of the multilayer body 12 is the second multilayer body main surface of the multilayer body 12. On the other hand, when the lower main surface (negative main surface) of the multilayer body 12 is referred to as the first multilayer body main surface of the multilayer body 12, the upper main surface (positive main surface) of the multilayer body 12 is the second multilayer body main surface of the multilayer body 12. In the present preferred embodiment, the upper main surface (positive main surface) of the multilayer body 12 is referred to as the first multilayer body main surface of the multilayer body 12, and the lower main surface (negative main surface) of the multilayer body 12 is referred to as the second multilayer body main surface of the multilayer body 12. In addition, as illustrated in FIG. 1, the multilayer body 12 has a structure in which resin layers 14*a* to 14*d* are stacked in the up-down direction. The resin layers 14*a* to 14*d* are arranged in this order from top to bottom. Each of the resin layers 14*a* to 14*d* has an upper main surface (positive main surface) and a lower main surface (negative main surface) arranged in this order in the downward direction (the negative direction of the Z axis).

In other words, each of the resin layers 14*a* to 14*d* has a first main surface and a second main surface arranged in the up-down direction (Z-axis direction). For example, when the upper main surface (positive main surface) of the resin layer 14*a* is referred to as the first main surface of the resin layer 14*a*, the lower main surface (negative main surface) of the resin layer 14*a* is the second main surface of the resin layer 14*a*. Similarly, when the upper main surface (positive main surface) of the resin layer 14*b* is referred to as the first main surface of the resin layer 14*b*, the lower main surface (negative main surface) of the resin layer 14*b* is the second main surface of the resin layer 14*b*. In addition, when the upper main surface (positive main surface) of the resin layer 14*c* is referred to as the first main surface of the resin layer 14*c*, the lower main surface (negative main surface) of the resin layer 14*c* is the second main surface of the resin layer 14*c*. In addition, when the upper main surface (positive main surface) of the resin layer 14*d* is referred to as the first main surface of the resin layer 14*d*, the lower main surface (negative main surface) of the resin layer 14*d* is the second main surface of the resin layer 14*d*.

On the other hand, when the lower main surface (negative main surface) of the resin layer 14*a* is referred to as the first main surface of the resin layer 14*a*, the upper main surface (positive main surface) of the resin layer 14*a* is the second main surface of the resin layer 14*a*. Similarly, when the lower main surface (negative main surface) of the resin layer 14*b* is referred to as the first main surface of the resin layer 14*b*, the upper main surface (positive main surface) of the resin layer 14*b* is the second main surface of the resin layer 14*b*. In addition, when the lower main surface (negative main surface) of the resin layer 14*c* is referred to as the first main surface of the resin layer 14*c*, the upper main surface (positive main surface) of the resin layer 14*c* is the second main surface of the resin layer 14*c*. In addition, when the lower main surface (negative main surface) of the resin layer 14*d* is referred to as the first main surface of the resin layer 14*d*, the upper main surface (positive main surface) of the resin layer 14*d* is the second main surface of the resin layer 14d. Note that the correspondence between the upper main surface (positive main surface) and the lower main surface (negative main surface), and the first main surface and the second main surface may be set for each resin layer. In the present preferred embodiment, the upper main surface (positive main surface) of the resin layer 14a is referred to as the first main surface of the resin layer 14a, and the lower main surface (negative main surface) of the resin layer 14a is referred to as the second main surface of the resin layer 14a. The upper main surface (positive main surface) of the resin layer 14b is referred to as the first main surface of the resin layer 14b, and the lower main surface (negative main surface) of the resin layer 14b is referred to as the second main surface of the resin layer 14b. The lower main surface (negative main surface) of the resin layer 14c is referred to as the first main surface of the resin layer 14c, and the upper main surface (positive main surface) of the resin layer 14c is referred to as the second main surface of the resin layer 14c. The lower main surface (negative main surface) of the resin layer 14d is referred to as the first main surface of the resin layer 14d, and the upper main surface (positive main surface) of the resin layer 14d is referred to as the second main surface of the resin layer 14d.

The resin layers 14a to 14d have the same strip shape as the shape of the multilayer body 12 when viewed in the up-down direction. The resin layers 14a to 14d are flexible dielectric sheets. A material of the resin layers 14a to 14d is resin. In the present preferred embodiment, the material of the resin layers 14a to 14d is a thermoplastic resin. The thermoplastic resin is, for example, a liquid crystal polymer, polytetrafluoroethylene (PTFE), or the like. Therefore, the resin layers 14a to 14d adjacent to each other in the up-down direction (Z-axis direction) are fused to each other. In addition, the material of the resin layers 14a to 14d may be polyimide. Thus, the multilayer body 12 has flexibility. In addition, the material of the resin layers 14a and 14d may be different from the material of the resin layers 14b and 14c. The material of the resin layers 14b and 14c is, for example, a resin having a small dielectric loss. The material of the resin layers 14a and 14d is, for example, a resin having excellent strength for surface protection.

As illustrated in FIG. 1, the signal conductor layer 20 is provided in the multilayer body 12. More specifically, the signal conductor layer 20 is located on the lower main surface (negative main surface) of the resin layer 14b (first resin layer). The signal conductor layer 20 has a linear shape. The signal conductor layer 20 extends in the left-right direction (X-axis direction). A high-frequency signal is transmitted to the signal conductor layer 20.

The first ground conductor layer 22 has an upper main surface (positive main surface) and a lower main surface (negative main surface) arranged in this order in the downward direction (the negative direction of the Z axis). In other words, the first ground conductor layer 22 includes a first ground conductor layer main surface and a second ground conductor layer main surface that are arranged in the up-down direction (Z-axis direction). For example, when the upper main surface (positive main surface) of the first ground conductor layer 22 is referred to as the first ground conductor layer main surface of the first ground conductor layer 22, the lower main surface (negative main surface) of the first ground conductor layer main surface of the first ground conductor layer 22. On the other hand, when the lower main surface (negative main surface) of the first ground conductor layer 22 is referred to as the first ground conductor layer main surface of the first ground conductor layer 22, the upper main surface (positive main surface) of the first ground conductor layer 22 is the second ground conductor layer main surface of the first ground conductor layer 22. In the present preferred embodiment, the upper main surface (positive main surface) of the first ground conductor layer 22 is referred to as the first ground conductor layer main surface of the first ground conductor layer 22, and the lower main surface (negative main surface) of the first ground conductor layer 22 is referred to as the second ground conductor layer main surface of the first ground conductor layer 22. As illustrated in FIG. 1, the first ground conductor layer 22 is provided in the multilayer body 12. More specifically, the first ground conductor layer 22 is located above the signal conductor layer 20. In the present preferred embodiment, the first ground conductor layer 22 is located on the lower main surface of the resin layer 14a. That is, the first ground conductor layer 22 is in contact with the upper main surface (positive main surface) of the resin layer 14b (first resin layer). The first ground conductor layer 22 covers substantially the entire lower main surface of the resin layer 14a. Thus, the first ground conductor layer 22 overlaps the signal conductor layer 20 when viewed in the up-down direction. The first ground conductor layer 22 is connected to the ground potential.

The second ground conductor layer 24 has an upper main surface (positive main surface) and a lower main surface (negative main surface) arranged in this order in the downward direction (the negative direction of the Z axis). In other words, the second ground conductor layer 24 includes a first ground conductor layer main surface and a second ground conductor layer main surface that are arranged in the up-down direction (Z-axis direction). For example, when the upper main surface (positive main surface) of the second ground conductor layer 24 is referred to as the first ground conductor layer main surface of the second ground conductor layer 24, the lower main surface (negative main surface) of the second ground conductor layer 24 is the second ground conductor layer main surface of the second ground conductor layer 24. On the other hand, when the lower main surface (negative main surface) of the second ground conductor layer 24 is referred to as the first ground conductor layer main surface of the second ground conductor layer 24, the upper main surface (positive main surface) of the second ground conductor layer 24 is the second ground conductor layer main surface of the second ground conductor layer 24. In the present preferred embodiment, the lower main surface (negative main surface) of the second ground conductor layer 24 is referred to as the first ground conductor layer main surface of the second ground conductor layer 24, and the upper main surface (positive main surface) of the second ground conductor layer 24 is the second ground conductor layer main surface of the second ground conductor layer 24. As illustrated in FIG. 1, the second ground conductor layer 24 is provided in the multilayer body 12. More specifically, the second ground conductor layer 24 is located below the signal conductor layer 20. In the present preferred embodiment, the second ground conductor layer 24 is located on the upper main surface of the resin layer 14d. That is, the second ground conductor layer 24 is in contact with the lower main surface (negative main surface) of the resin layer 14c (first resin layer). The second ground conductor layer 24 covers substantially the entire upper main surface of the resin layer 14d. In addition, the second ground conductor layer 24 overlaps the signal conductor layer 20 when viewed in the up-down direction. The second ground conductor layer 24 is connected to the ground potential. Thus, the signal conductor layer 20, the first ground conductor layer 22, and the second ground conductor layer 24 have a strip line structure.

As illustrated in FIG. 1, the third ground conductor layer 26 is provided in the multilayer body 12. More specifically, the position of the third ground conductor layer 26 in the up-down direction is the same as the position of the signal conductor layer 20 in the up-down direction. In the present preferred embodiment, the third ground conductor layer 26 is located on the lower main surface of the resin layer 14b. In addition, the third ground conductor layer 26 has an annular shape surrounding the signal conductor layer 20 when viewed in the up-down direction. Therefore, the third ground conductor layer 26 includes a third ground conductor layer front portion 26f, a third ground conductor layer back portion 26b, a third ground conductor layer left portion 261, and a third ground conductor layer right portion 26r. The third ground conductor layer front portion 26f is located forward of the signal conductor layer 20. The third ground conductor layer back portion 26b is located behind the signal conductor layer 20. Each of the third ground conductor layer front portion 26f and the third ground conductor layer back portion 26b extends in the left-right direction. The third ground conductor layer left portion 261 is located on the left of the signal conductor layer 20. The third ground conductor layer right portion 26r is located on the right of the signal conductor layer 20. Each of the third ground conductor layer left portion 261 and the third ground conductor layer right portion 26r extends in the front-back direction. The third ground conductor layer 26 is connected to the ground potential.

The plurality of through conductors v1 passes through the resin layer 14b (first resin layer) in the up-down direction (Z-axis direction). The resin layer 14b (first resin layer) is different from the resin layers 14a and 14d located at both ends in the up-down direction (Z-axis direction) of the resin layers 14a to 14d. The plurality of through conductors v1 is located forward of the signal conductor layer 20 when viewed in the up-down direction. The plurality of through conductors v1 is arranged in a row in the left-right direction. The plurality of through conductors v1 has a rectangular or substantially rectangular shape having two long sides extending in the left-right direction and two short sides extending in the front-back direction when viewed in the up-down direction. Upper ends of the plurality of through conductors v1 are in contact with the first ground conductor layer 22. Lower ends of the plurality of through conductors v1 are in contact with the third ground conductor layer front portion 26f.

The plurality of through conductors v2 passes through the resin layer 14c (first resin layer) in the up-down direction (Z-axis direction). The resin layer 14c (first resin layer) is different from the resin layers 14a and 14d located at both ends in the up-down direction (Z-axis direction) of the resin layers 14a to 14d. The plurality of through conductors v2 is located forward of the signal conductor layer 20 when viewed in the up-down direction. The plurality of through conductors v2 is arranged in a row in the left-right direction. In addition, the plurality of through conductors v2 each overlaps the plurality of through conductors v1 when viewed in the up-down direction. The plurality of through conductors v2 has a rectangular or substantially rectangular shape having two long sides extending in the left-right direction and two short sides extending in the front-back direction when viewed in the up-down direction. Upper ends of the plurality of through conductors v2 are in contact with the third ground conductor layer front portion 26f. Lower ends of the plurality of through conductors v2 are in contact with the second ground conductor layer 24.

The plurality of through conductors v3 passes through the resin layer 14b (first resin layer) in the up-down direction (Z-axis direction). The resin layer 14b (first resin layer) is different from the resin layers 14a and 14d located at both ends in the up-down direction (Z-axis direction) of the resin layers 14a to 14d. The plurality of through conductors v3 is located behind the signal conductor layer 20 when viewed in the up-down direction. The plurality of through conductors v3 is arranged in a row in the left-right direction. The plurality of through conductors v3 has a rectangular or substantially rectangular shape having two long sides extending in the left-right direction and two short sides extending in the front-back direction when viewed in the up-down direction. Upper ends of the plurality of through conductors v3 are in contact with the first ground conductor layer 22. Lower ends of the plurality of through conductors v3 are in contact with the third ground conductor layer back portion 26b.

The plurality of through conductors v4 passes through the resin layer 14c (first resin layer) in the up-down direction (Z-axis direction). The resin layer 14c (first resin layer) is different from the resin layers 14a and 14d located at both ends in the up-down direction (Z-axis direction) of the resin layers 14a to 14d. The plurality of through conductors v4 is located behind the signal conductor layer 20 when viewed in the up-down direction. The plurality of through conductors v4 is arranged in a row in the left-right direction. In addition, the plurality of through conductors v4 each overlaps the plurality of through conductors v3 when viewed in the up-down direction. The plurality of through conductors v4 has a rectangular or substantially rectangular shape having two long sides extending in the left-right direction and two short sides extending in the front-back direction when viewed in the up-down direction. Upper ends of the plurality of through conductors v4 are in contact with the third ground conductor layer back portion 26b. Lower ends of the plurality of through conductors v4 are in contact with the second ground conductor layer 24.

The through conductor v5 passes through the resin layer 14b (first resin layer) in the up-down direction (Z-axis direction). The resin layer 14b (first resin layer) is different from the resin layers 14a and 14d located at both ends in the up-down direction (Z-axis direction) of the resin layers 14a to 14d. The through conductor v5 is located on the left of the signal conductor layer 20 when viewed in the up-down direction. The through conductor v5 has a rectangular or substantially rectangular shape having two long sides extending in the front-back direction and two short sides extending in the left-right direction when viewed in the up-down direction. Upper ends of the through conductors v5 is in contact with the first ground conductor layer 22. Lower ends of the through conductors v5 are in contact with the third ground conductor layer left portion 261.

The through conductor v6 passes through the resin layer 14c (first resin layer) in the up-down direction (Z-axis direction). The resin layer 14c (first resin layer) is different from the resin layers 14a and 14d located at both ends in the up-down direction (Z-axis direction) of the resin layers 14a to 14d. The through conductor v6 is located on the left of the signal conductor layer 20 when viewed in the up-down direction. In addition, the through conductor v6 overlaps the through conductor v5 when viewed in the up-down direction. The through conductor v6 has a rectangular or substantially rectangular shape having two long sides extending in the front-back direction and two short sides extending in the left-right direction when viewed in the up-down direction. Upper ends of the through conductors v6 is in contact with the third ground conductor layer left portion 261. Lower ends of the through conductors v6 is in contact with the second ground conductor layer 24.

The through conductor v7 passes through the resin layer 14b (first resin layer) in the up-down direction (Z-axis direction). The resin layer 14b (first resin layer) is different from the resin layers 14a and 14d located at both ends in the up-down direction (Z-axis direction) of the resin layers 14a to 14d. The through conductor v7 is located on the right of the signal conductor layer 20 when viewed in the up-down direction. The through conductor v7 has a rectangular or substantially rectangular shape having two long sides extending in the front-back direction and two short sides extending in the left-right direction when viewed in the up-down direction. Upper ends of the through conductors v7 is in contact with the first ground conductor layer 22. Lower ends of the through conductors v7 are in contact with the third ground conductor layer right portion 26r.

The through conductor v8 passes through the resin layer 14c (first resin layer) in the up-down direction (Z-axis direction). The resin layer 14c (first resin layer) is different from the resin layers 14a and 14d located at both ends in the up-down direction (Z-axis direction) of the resin layers 14a to 14d. The through conductor v8 is located on the right of the signal conductor layer 20 when viewed in the up-down direction. In addition, the through conductor v8 overlaps the through conductor v7 when viewed in the up-down direction. The through conductor v8 has a rectangular or substantially rectangular shape having two long sides extending in the front-back direction and two short sides extending in the left-right direction when viewed in the up-down direction. Upper ends of the through conductors v8 is in contact with the third ground conductor layer right portion 26r. Lower ends of the through conductors v8 is in contact with the second ground conductor layer 24.

In addition, each of the plurality of through conductors v1, the plurality of through conductors v3, the through conductor v5, and the through conductor v7 has a truncated quadrangular pyramid shape. The plurality of through conductors v1, the plurality of through conductors v3, the through conductor v5, and the through conductor v7 have an increase section AI. In the increase section AI, cross-sectional areas of the plurality of through conductors v1, the plurality of through conductors v3, the through conductor v5, and the through conductor v7 are orthogonal to the up-down direction (Z-axis direction) and increase toward an upward direction (the positive direction of the Z axis). An upper end (an end in the positive direction of the Z axis) of the increase section AI is located on the upper main surface (positive main surface) of the resin layer 14b (first resin layer) in the up-down direction (Z-axis direction). In addition, a lower end of the increase section AI is located on the lower main surface of the resin layer 14b in the up-down direction. Therefore, as illustrated in FIG. 2, the cross-sectional areas of the plurality of through conductors v1, the plurality of through conductors v3, the through conductor v5, and the through conductor v7, which are orthogonal to the up-down direction, increase toward the upward direction. As such, areas of the upper ends of the plurality of through conductors v1, the plurality of through conductors v3, the through conductor v5, and the through conductor v7 are larger than areas of the lower ends of the plurality of through conductors v1, the plurality of through conductors v3, the through conductor v5, and the through conductor v7.

In other words, each of the plurality of through conductors v1, the plurality of through conductors v3, the through conductor v5, and the through conductor v7 has a tapered region TA. More specifically, the tapered region TA of the plurality of through conductors v1 is a region in which the cross-sectional area of the plurality of through conductors v1 orthogonal to the up-down direction (Z-axis direction) increases toward the upper main surface (positive main surface) of the resin layer 14b (first resin layer) in the up-down direction (Z-axis direction). Similarly, the tapered region TA of the plurality of through conductors v3 is a region in which the cross-sectional area of the plurality of through conductors v3 orthogonal to the up-down direction (Z-axis direction) increases toward the upper main surface (positive main surface) of the resin layer 14b (first resin layer) in the up-down direction (Z-axis direction). In addition, the tapered region TA of the through conductor v5 is a region in which the cross-sectional area of the through conductor v5 orthogonal to the up-down direction (Z-axis direction) increases toward the upper main surface (positive main surface) of the resin layer 14b (first resin layer) in the up-down direction (Z-axis direction). In addition, the tapered region TA of the through conductor v7 is a region in which the cross-sectional area of the through conductor v7 orthogonal to the up-down direction (Z-axis direction) increases toward the upper main surface (positive main surface) of the resin layer 14b (first resin layer) in the up-down direction (Z-axis direction). The respective tapered regions TA of the plurality of through conductors v1, the plurality of through conductors v3, the through conductor v5, and the through conductor v7 are in contact with the upper main surface (positive main surface) of the resin layer 14b (first resin layer).

In addition, each of the plurality of through conductors v2 and the plurality of through conductors v4 has a truncated quadrangular pyramid shape. The plurality of through conductors v2, the plurality of through conductors v4, the through conductor v6, and the through conductor v8 have a decrease section AD. In the decrease section AD, cross-sectional areas of the plurality of through conductors v2, the plurality of through conductors v4, the through conductor v6, and the through conductor v8 are orthogonal to the up-down direction (Z-axis direction) and decrease toward the upward direction (the positive direction of the Z axis). A lower end (an end in the negative direction of the Z axis) of the decrease section AD is located on the lower main surface (the negative main surface) of the resin layer 14c (the first resin layer) in the up-down direction (Z-axis direction). In addition, an upper end of the decrease section AD is located on the upper main surface of the resin layer 14c in the up-down direction. Therefore, as illustrated in FIG. 2, the cross-sectional areas of the plurality of through conductors v2, the plurality of through conductors v4, the through conductor v6, and the through conductor v8 orthogonal to the up-down direction (Z-axis direction) decrease toward the upward direction (the positive direction of the Z axis). Therefore, areas of the upper ends of the plurality of through conductors v2, the plurality of through conductors v4, the through conductor v6, and the through conductor v8 are smaller than areas of the lower ends of the plurality of through conductors v2, the plurality of through conductors v4, the through conductor v6, and the through conductor v8.

In other words, each of the plurality of through conductors v2, the plurality of through conductors v4, the through conductor v6, and the through conductor v8 has a tapered region TA. More specifically, the tapered region TA of the plurality of through conductors v2 is a region in which the cross-sectional area of the plurality of through conductor v2 orthogonal to the up-down direction (Z-axis direction) increases toward the lower main surface (negative main surface) of the resin layer 14c (first resin layer) in the up-down direction (Z-axis direction). Similarly, the tapered region TA of the plurality of through conductors v4 is a region in which the cross-sectional area of the plurality of through conductors v4 orthogonal to the up-down direction (Z-axis direction) increases toward the lower main surface (negative main surface) of the resin layer 14b (first resin layer) in the up-down direction (Z-axis direction). In addition, the tapered region TA of the through conductor v6 is a region in which the cross-sectional area of the through conductor v6 orthogonal to the up-down direction (Z-axis direction) increases toward the lower main surface (negative main surface) of the resin layer 14c (first resin layer) in the up-down direction (Z-axis direction). In addition, the tapered region TA of the through conductor v8 is a region in which the cross-sectional area of the through conductor v8 orthogonal to the up-down direction (Z-axis direction) increases toward the lower main surface (negative main surface) of the resin layer 14c (first resin layer) in the up-down direction (Z-axis direction). The respective tapered regions TA of the plurality of through conductors v2, the plurality of through conductors v4, the through conductor v6, and the through conductor v8 are in contact with the lower main surface (negative main surface) of the resin layer 14c (first resin layer).

The plurality of through conductors v1, the plurality of through conductors v2, the plurality of through conductors v3, the plurality of through conductors v4, the through conductor v5, the through conductor v6, the through conductor v7, and the through conductor v8 as described above electrically connect the first ground conductor layer 22, the second ground conductor layer 24, and the third ground conductor layer 26. The first ground conductor layer 22, the second ground conductor layer 24, and the third ground conductor layer 26 are connected to the ground potential.

The outer electrodes 30a and 30b are electrically connected to an external circuit (not illustrated). The external circuit is an electric circuit provided outside the multilayer substrate 10. The outer electrodes 30a and 30b are provided on the multilayer body 12. The outer electrodes 30a and 30b are exposed from the upper main surface (positive main surface) of the multilayer body 12. More specifically, the outer electrode 30a is located in the vicinity of a left end of the upper main surface of the resin layer 14b. The outer electrode 30b is located in the vicinity of a right end of the upper main surface of the resin layer 14b. Each of the outer electrodes 30a and 30b has a rectangular or substantially rectangular shape when viewed in the up-down direction. However, the outer electrodes 30a and 30b are not in contact with the first ground conductor layer 22. Connectors (not illustrated) are mounted on the outer electrodes 30a and 30b by soldering. This connector is connected to a connector of a circuit board (not illustrated). Thus, the multilayer substrate 10 and the circuit board (not illustrated) are electrically connected to each other. Note that the multilayer substrate 10 may be connected to a circuit board by surface mounting without using a connector.

Openings ha to hj are provided in the resin layer 14a. The openings ha to he are provided at a left end portion of the resin layer 14a. The openings ha to he pass through the resin layer 14a in the up-down direction. The opening hb is located on the left of the opening ha. The opening he is located on the right of the opening ha. The opening hd is located in front of the opening ha. The opening he is located behind the opening ha. The outer electrode 30a is exposed from the opening ha. The first ground conductor layer 22 is exposed from the openings hb to he. Since the openings hf to hj have a bilaterally symmetrical structure with the openings ha to he, description thereof will be omitted.

The through conductor v10 passes through the resin layer 14b in the up-down direction. The through conductor v10 overlaps a left end portion of the signal conductor layer 20 and the outer electrode 30a when viewed in the up-down direction. The through conductor v10 has a rectangular or substantially rectangular shape when viewed in the up-down direction. Upper ends of through conductors v10 is in contact with the outer electrode 30a. Lower ends of the through conductors v10 is in contact with the left end portion of the signal conductor layer 20. Thus, the signal conductor layer 20 is electrically connected to the outer electrode 30a.

The through conductor v11 passes through the resin layer 14b in the up-down direction. The through conductor v11 overlaps a right end portion of the signal conductor layer 20 and the outer electrode 30b when viewed in the up-down direction. The through conductor v11 has a rectangular or substantially rectangular shape when viewed in the up-down direction. Upper ends of the through conductors v11 is in contact with the outer electrode 30b. Lower ends of the through conductors v11 is in contact with the right end portion of the signal conductor layer 20. Thus, the signal conductor layer 20 is electrically connected to the outer electrode 30b.

The signal conductor layer 20, the first ground conductor layer 22, the second ground conductor layer 24, the third ground conductor layer 26, and the outer electrodes 30a and 30b as described above are formed by patterning on a metal foil attached to the upper main surfaces or the lower main surfaces of the resin layers 14a, 14b, and 14d. The metal foil is, for example, a copper foil. The plurality of through conductors v1, the plurality of through conductors v2, the plurality of through conductors v3, the plurality of through conductors v4, and the through conductors v5 to v8, v10, and v11 are formed by filling through-holes that pass through the resin layers 14a to 14c in the up-down direction with a conductive paste and solidifying the conductive paste by heating. However, the plurality of through conductors v1, the plurality of through conductors v2, the plurality of through conductors v3, the plurality of through conductors v4, and the through conductors v5 to v8, v10, and v11 may be formed by plating the through-holes that pass through the resin layers 14a to 14c in the up-down direction. In addition, solder may be used instead of the conductive paste.

As illustrated in FIG. 2 and FIG. 3, the multilayer body 12 is provided with a hollow portion Sp1 which is a resin-free cavity. The hollow portion Sp1 is provided in the resin layer 14b (first resin layer). More specifically, the hollow portion Sp1 is provided on the upper main surface (positive main surface) of the resin layer 14b (first resin layer). However, the hollow portion Sp1 does not pass through the resin layer 14b (first resin layer) in the up-down direction (Z-axis direction). Therefore, the hollow portion Sp1 extends in the downward direction (the negative direction of the Z axis) from the upper main surface (positive main surface) of the resin layer 14b (first resin layer). Accordingly, a portion of the upper main surface (positive main surface) of the resin layer 14b (first resin layer) has a shape recessed in the downward direction (the negative direction of the Z axis). In addition, the portion of the upper main surface (positive main surface) of the resin layer 14b (first resin layer) forms an inner wall in contact with an inner peripheral surface Sa of the hollow portion Sp1. A lower end of the hollow portion Sp1 (the end in the negative direction of the Z axis) is located above the lower main surface (negative main surface) of the resin layer 14*b* (first resin layer).

The hollow portion Sp1 is located above the signal conductor layer 20 (in the positive direction of the Z axis). Therefore, the hollow portion Sp1 is not in contact with the signal conductor layer 20. As illustrated in FIG. 1, the hollow portion Sp1 extends in the left-right direction along the signal conductor layer 20. As illustrated in FIG. 2 and FIG. 3, the hollow portion Sp1 overlaps the signal conductor layer 20 when viewed in the up-down direction (Z-axis direction). However, the left end portion and the right end portion of the signal conductor layer 20 do not overlap the hollow portion Sp1 when viewed in the up-down direction. In addition, the hollow portion Sp1 does not overlap the plurality of through conductors v1, the plurality of through conductors v3, and the through conductors v5 and v7 when viewed in the up-down direction (Z-axis direction). In addition, the hollow portion Sp1 overlaps the plurality of through conductors v1 and the plurality of through conductors v3 when viewed in the front-back direction (Y-axis direction).

A cross-sectional area of the hollow portion Sp1 orthogonal to the up-down direction (Z-axis direction) increases toward the upward direction (the positive direction of the Z axis). As illustrated in FIG. 2 and FIG. 3, the inner peripheral surface Sa of the hollow portion Sp1 includes a top surface S1, a side surface S2, and a bottom surface S3. The top surface S1 is a surface facing the downward direction. The top surface S1 is a portion of the lower main surface (negative main surface) of the first ground conductor layer 22. The bottom surface S3 faces the top surface S1. The side surface S2 extends in the up-down direction (Z-axis direction). However, the side surface S2 is inclined with respect to the up-down direction. The side surface S2 connects the top surface S1 and the bottom surface S3. The side surface S2 is a portion of the resin layer 14*b* (first resin layer). The side surface S2 defines an acute angle with the top surface S1. However, the resin layers 14*a* to 14*d* are integrated by thermal pressure bonding. Therefore, after thermal pressure bonding of the resin layers 14*a* to 14*d*, a cross-sectional shape of the hollow portion Sp1 orthogonal to the left-right direction may be deformed from the trapezoidal shape illustrated in FIG. 2. Therefore, a bonding portion between the side surface S2 and the top surface S1 and a bonding portion between the side surface S2 and the bottom surface S3 may be curved surfaces.

In other words, the hollow portion Sp1 has the tapered region TA. More specifically, the tapered region TA of the hollow portion Sp1 is a region in which the cross-sectional area of the hollow portion Sp1 orthogonal to the up-down direction (Z-axis direction) increases toward the upper main surface (positive main surface) of the resin layer 14*b* (first resin layer) in the up-down direction (Z-axis direction). The tapered region TA of the hollow portion Sp1 is in contact with the upper main surface (positive main surface) of the resin layer 14*b* (first resin layer).

As illustrated in FIG. 2 and FIG. 3, the multilayer body 12 is provided with a hollow portion Sp2 which is a resin-free cavity. The hollow portion Sp2 is provided in the resin layer 14*c* (first resin layer). More specifically, the hollow portion Sp2 is provided on the lower main surface (negative main surface) of the resin layer 14*c* (first resin layer). However, the hollow portion Sp2 does not pass through the resin layer 14*c* (first resin layer) in the up-down direction (Z-axis direction). Therefore, the hollow portion Sp2 extends in the upward direction (the positive direction of the Z axis) from the lower main surface (negative main surface) of the resin layer 14*c* (first resin layer). Thus, a portion of the lower main surface (negative main surface) of the resin layer 14*c* (first resin layer) has a shape recessed in the upward direction (the positive direction of the Z axis). In addition, the portion of the lower main surface (negative main surface) of the resin layer 14*c* (first resin layer) forms an inner wall in contact with an inner peripheral surface Sb of the hollow portion Sp2. An upper end (the end in the positive direction of the Z axis) of the hollow portion Sp2 is located below the upper main surface (positive main surface) of the resin layer 14*c* (first resin layer).

The hollow portion Sp2 is located below the signal conductor layer 20 (in the negative direction of the Z axis). Therefore, the hollow portion Sp2 is not in contact with the signal conductor layer 20. As illustrated in FIG. 1, the hollow portion Sp2 extends in the left-right direction along the signal conductor layer 20. As illustrated in FIG. 2 and FIG. 3, the hollow portion Sp2 overlaps the signal conductor layer 20 when viewed in the up-down direction (Z-axis direction). However, the left end portion and the right end portion of the signal conductor layer 20 do not overlap the hollow portion Sp2 when viewed in the up-down direction. When viewed in the up-down direction (Z-axis direction), the hollow portion Sp2 does not overlap the plurality of through conductors v2, the plurality of through conductors v4, and the through conductors v6 and v8. In addition, the hollow portion Sp2 overlaps the plurality of through conductors v2 and the plurality of through conductors v4 when viewed in the front-back direction (Y-axis direction).

A cross-sectional area of the hollow portion Sp2 orthogonal to the up-down direction (Z-axis direction) decreases toward the upward direction (the positive direction of the Z axis). As illustrated in FIG. 2 and FIG. 3, the inner peripheral surface Sb of the hollow portion Sp2 includes a top surface S4, a side surface S5, and a bottom surface S6. The top surface S4 is a surface facing the upward direction. The top surface S4 is a portion of the upper main surface (positive main surface) of the second ground conductor layer 24. The bottom surface S6 faces the top surface S4. The side surface S5 extends in the up-down direction (Z-axis direction). The side surface S5 connects the top surface S4 and the bottom surface S6. The side surface S5 is a portion of the resin layer 14*c* (first resin layer). The side surface S5 defines an acute angle with the top surface S4.

In other words, the hollow portion Sp2 has the tapered region TA. More specifically, the tapered region TA of the hollow portion Sp2 is a region in which the cross-sectional area of the hollow portion Sp2 orthogonal to the up-down direction (Z-axis direction) increases toward the lower main surface (negative main surface) of the resin layer 14*c* (first resin layer) in the up-down direction (Z-axis direction). The tapered region TA of the hollow portion Sp2 is in contact with the lower main surface (negative main surface) of the resin layer 14*c* (first resin layer).

Effect

According to the multilayer substrate 10, the dielectric loss generated in the multilayer substrate 10 can be reduced. More specifically, in the multilayer substrate 10, the hollow portion Sp1 overlaps the signal conductor layer 20 when viewed in the up-down direction. Thus, the dielectric constant around the signal conductor layer 20 is lowered. As a result, the dielectric loss is reduced in the multilayer substrate 10.

In the multilayer substrate, when the hollow portion is provided in the multilayer body, the strength of the multilayer body is reduced. As a result, breakage is likely to occur in the multilayer body. Thus, the hollow portion Sp1 has the tapered region TA in which the cross-sectional area of the hollow portion Sp1 orthogonal to the up-down direction increases toward the upper main surface (positive main surface) of the resin layer 14*b* (first resin layer) (first main surface of the first resin layer) in the up-down direction. Thus, the side surface S2 is inclined with respect to the up-down direction. As a result, when a force is applied to the multilayer body 12 in the up-down direction, the force applied to the side surface S2 is dispersed. Thus, the occurrence of breakage in the multilayer body 12 is reduced or prevented. However, in an upper portion of the hollow portion Sp1, the sizes in the front-back direction and the left-right direction of the hollow portion Sp1 are large. Therefore, the strength of the multilayer body 12 in the vicinity of the upper portion of the hollow portion Sp1 is likely to be low. Thus, the plurality of through conductors v1, the plurality of through conductors v3, the through conductor v5, and the through conductor v7 each have the tapered region TA in which the cross-sectional areas of the plurality of through conductors v1, the plurality of through conductors v3, the through conductor v5, and the through conductor v7 orthogonal to the up-down direction increase toward the upper main surface (positive main surface) of the resin layer 14*b* (first resin layer) (first main surface of the first resin layer) in the up-down direction. The respective tapered regions TA of the plurality of through conductors v1, the plurality of through conductors v3, the through conductor v5, and the through conductor v7 are in contact with the upper main surface (positive main surface) of the resin layer 14*b* (first resin layer). The plurality of through conductors v1, the plurality of through conductors v3, the through conductor v5, and the through conductor v7 have a higher strength than the resin layer 14*a*. Thus, a decrease in the strength of the multilayer body 12 in the vicinity of the upper portion of the hollow portion Sp1 is reduced or prevented. As described above, the occurrence of breakage in the multilayer body 12 is reduced or prevented.

In addition, according to the multilayer substrate 10, fluctuation of the characteristic impedance generated in the signal conductor layer 20 from a desired characteristic impedance (for example, about 50Ω) is reduced or prevented. The plurality of through conductors v1, the plurality of through conductors v3, the through conductor v5, and the through conductor v7 each have the tapered region TA. In the tapered region TA, the cross-sectional areas of the plurality of through conductors v1, the plurality of through conductors v3, the through conductor v5, and the through conductor v7 orthogonal to the up-down direction become larger toward the upper main surface (positive main surface) of the resin layer 14*b* (first resin layer) (first main surface of the first resin layer) in the up-down direction. The respective tapered regions TA of the plurality of through conductors v1, the plurality of through conductors v3, the through conductor v5, and the through conductor v7 are in contact with the upper main surface (positive main surface) of the resin layer 14*b* (first resin layer). In other words, in a lower portion of the tapered region TA, the sizes of the plurality of through conductors v1, the plurality of through conductors v3, the through conductor v5, and the through conductor v7 in the front-back direction and the left-right direction are small. Therefore, the plurality of through conductors v1, the plurality of through conductors v3, the through conductor v5, and the through conductor v7 are prevented from being too close to the signal conductor layer 20, and an increase in capacitance generated between the plurality of through conductors v1, the plurality of through conductors v3, the through conductor v5, and the through conductor v7 and the signal conductor layer 20 is reduced or prevented. As a result, fluctuation of the characteristic impedance generated in the signal conductor layer 20 from the desired characteristic impedance (for example, about 50Ω) is reduced or prevented. In addition, since an increase in the capacitance generated between the signal conductor layer 20 and the plurality of through conductors v1, the plurality of through conductors v3, the through conductor v5, and the through conductor v7 is reduced or prevented, the signal conductor layer 20 can be made thicker. As a result, conductor loss of the signal conductor layer 20 is reduced.

In addition, in the multilayer substrate 10, the cross-sectional area of the hollow portion Sp1 orthogonal to the up-down direction increases toward the upper main surface (positive main surface) of the resin layer 14*b* (first resin layer) (the first main surface of the first resin layer) in the up-down direction. Thus, the side surface S2 is inclined with respect to the up-down direction. Therefore, when a high-frequency signal is reflected by the side surface S2, the high-frequency signal travels in a direction inclined with respect to the left-right direction. As a result, a standing wave is less likely to occur in the multilayer substrate 10.

In addition, in the multilayer substrate 10, the hollow portion Sp1 does not pass through the resin layer 14*b* in the up-down direction. Therefore, peeling of the resin layer 14*b* off from the resin layer 14*c* is reduced or prevented.

Further, in the multilayer substrate 10, the signal conductor layer 20 is located between the resin layer 14*b* and the resin layer 14*c*. Thus, the signal conductor layer 20 is less likely to be exposed to air. Therefore, deterioration such as humus is less likely to occur in the signal conductor layer 20. In addition, the resin layers 14*b* and 14*c* have high flexibility. Therefore, the signal conductor layer 20 and the resin layers 14*b* and 14*c* are less likely to be damaged by impact.

In addition, according to the multilayer substrate 10, the resin layers 14*a* to 14*d* adjacent to each other in the up-down direction are fused to each other. This eliminates the need for an adhesive layer for bonding the resin layers 14*a* to 14*d*. Transmission loss caused by the presence of the adhesive layer is reduced. In addition, since moisture is less likely to enter gaps between the resin layers 14*a* to 14*d*, corrosion of the signal conductor layer 20 is less likely to occur. Note that in FIG. 2, voids are present on the left and right sides in between the resin layers 14*a* to 14*d* and the first ground conductor layer 22 and the second ground conductor layer 24. However, these voids need not be present.

In addition, in the multilayer substrate 10, the lower ends of the plurality of through conductors v1 and the lower ends of the plurality of through conductors v3 are in contact with the third ground conductor layer 26. Further, the third ground conductor layer 26 is located on the lower main surface of the resin layer 14*b*. Thus, when the plurality of through conductors v1 and the plurality of through conductors v3 are formed, lower ends of the plurality of through-holes formed in the resin layer 14*b* are covered with the third ground conductor layer 26. As a result, it is possible to fill the through-holes of the sheet-like resin layer 14*b* with the conductive paste.

In addition, in the multilayer substrate 10, the material of the resin layers 14*a* to 14*d* is, for example, a liquid crystal polymer or PTFE. These materials have a low dielectric constant and a low dissipation factor. Therefore, the transmission loss of the multilayer substrate 10 is reduced.

In addition, in the multilayer substrate 10, the third ground conductor layer front portion 26*f* is electrically connected to the first ground conductor layer 22 and the second ground conductor layer 24 by the plurality of through conductors v1 and the plurality of through conductors v2. As a result, inductor components generated in the third ground conductor layer front portion 26f are reduced. As a result, a resonant frequency of a resonant circuit including the inductor components and stray capacitance increases. Therefore, the resonant frequency of the resonant circuit is greatly separated from the frequency of the high-frequency signal. In addition, since the inductor components generated in the third ground conductor layer front portion 26f are reduced, the width of the third ground conductor layer front portion 26f in the front-back direction may be reduced. Thus, the width of the multilayer substrate 10 in the front-back direction is reduced.

First Modification

Figure 4:
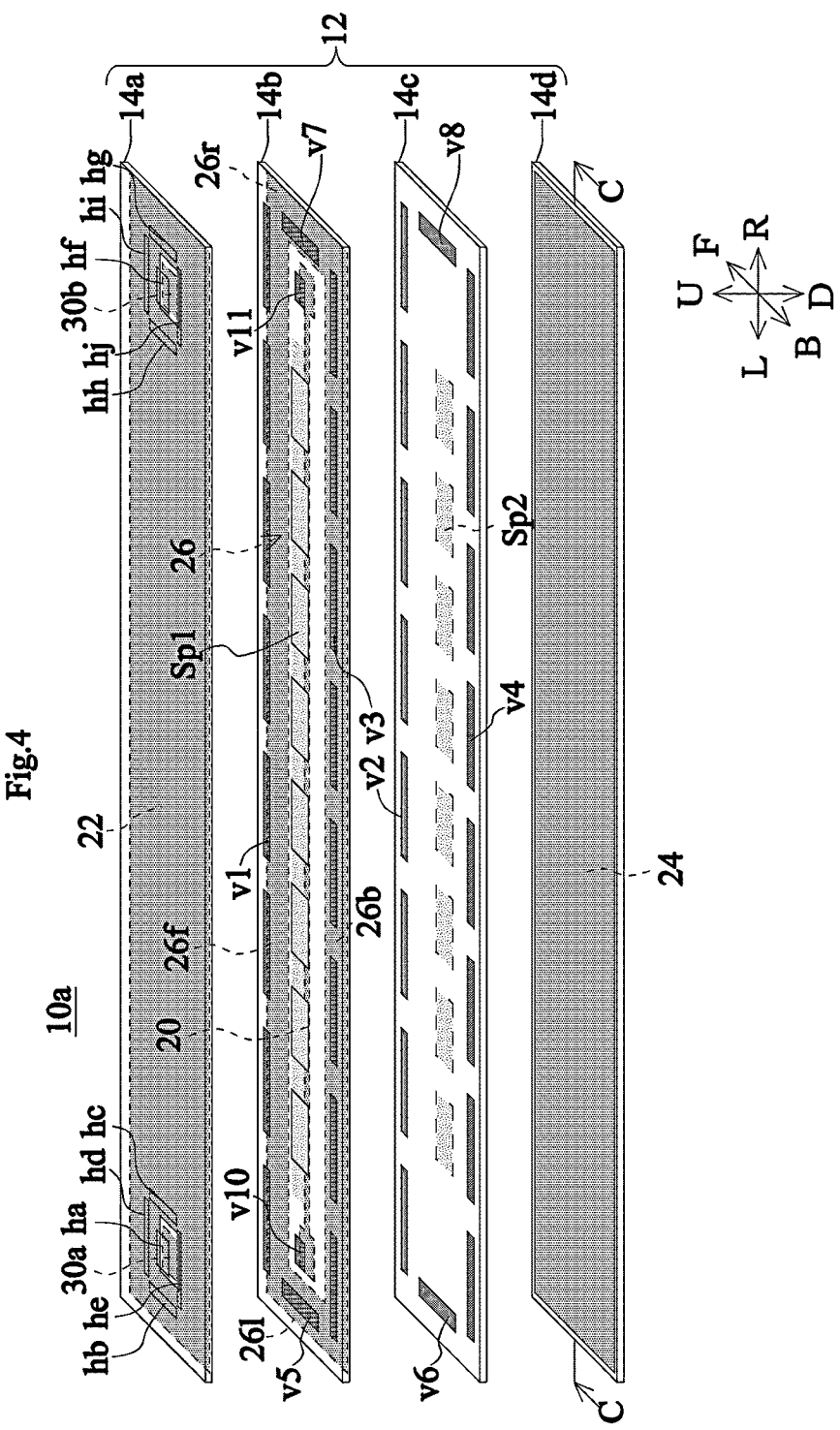
Figure 5:
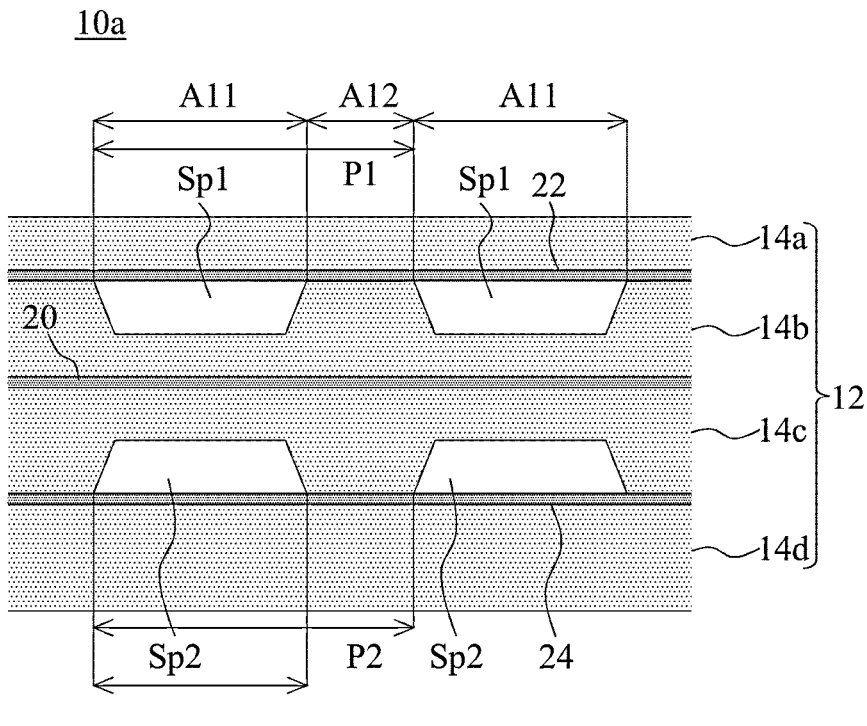
FIG. 5 is a cross-sectional view of the multilayer substrate 10a taken along line C-C.

Hereinafter, a multilayer substrate 10a according to a first modification will be described with reference to the drawings. FIG. 4 is an exploded perspective view of the multilayer substrate 10a. FIG. 5 is a cross-sectional view of the multilayer substrate 10a taken along line C-C.

The multilayer substrate 10a is different from the multilayer substrate 10 in that the number of hollow portions Sp1 is plural and the number of hollow portions Sp2 is plural. More specifically, in the multilayer substrate 10a, a plurality of hollow portions Sp1 is provided in the resin layer 14b. The plurality of hollow portions Sp1 is arranged in a row in the left-right direction. The plurality of hollow portions Sp1 overlaps the signal conductor layer 20 when viewed in the up-down direction. Therefore, the plurality of hollow portions Sp1 is arranged along the signal conductor layer 20. When viewed in the up-down direction (Z-axis direction), a distance P1 between left ends (ends in the positive direction of the X-axis direction) of two adjacent hollow portions Sp1 is equal to or less than about one eighth of a wavelength of a high-frequency signal transmitted through the signal conductor layer 20.

In addition, a plurality of hollow portions Sp2 is provided in the resin layer 14c. The plurality of hollow portions Sp2 is arranged in a row in the left-right direction. The plurality of hollow portions Sp2 overlaps the signal conductor layer 20 when viewed in the up-down direction. Therefore, the plurality of hollow portions Sp2 is arranged along the signal conductor layer 20. When viewed in the up-down direction (Z-axis direction), a distance P2 between left ends (ends in the positive direction of the X-axis direction) of two adjacent hollow portions Sp2 is equal to or less than about one eighth of the wavelength of a high-frequency signal transmitted through the signal conductor layer 20. Since the other structure of the multilayer substrate 10a is the same as that of the multilayer substrate 10, description thereof will be omitted. The multilayer substrate 10a can achieve the same effects as the multilayer substrate 10.

According to the multilayer substrate 10a, loss inside the multilayer substrate 10a can be reduced or prevented. More specifically, the characteristic impedance generated in the signal conductor layer 20 in a first section A11 in which the hollow portion Sp1 is provided is different from the characteristic impedance generated in the signal conductor layer 20 in a second section A12 in which the hollow portion Sp1 is not provided. Therefore, reflection of the high-frequency signal is likely to occur at a boundary between the first section A11 and the second section A12. The reflected high-frequency signal is reflected again because the characteristic impedance changes also in a reflection direction. Thus, multiple reflection occurs. When the length of the first sections A11 and the second section A12 in the left-right direction (i.e., a cycle of the characteristic impedance change) is about ¼ times the wavelength of the high-frequency signal transmitted through the signal conductor layer 20, the original high-frequency signal and the multiple-reflected high-frequency signal are out of phase by about ½ and are in opposite phase to cancel each other out, for example. As a result, the intensity of the high-frequency signal decreases. Therefore, when viewed in the up-down direction (Z-axis direction), the distance P1 between the left ends (the ends in the positive direction of the X-axis direction) of two adjacent hollow portions Sp1 is desirably equal to or less than about one eighth of the wavelength of the high-frequency signal transmitted through the signal conductor layer 20.

Second Modification

Figure 6:
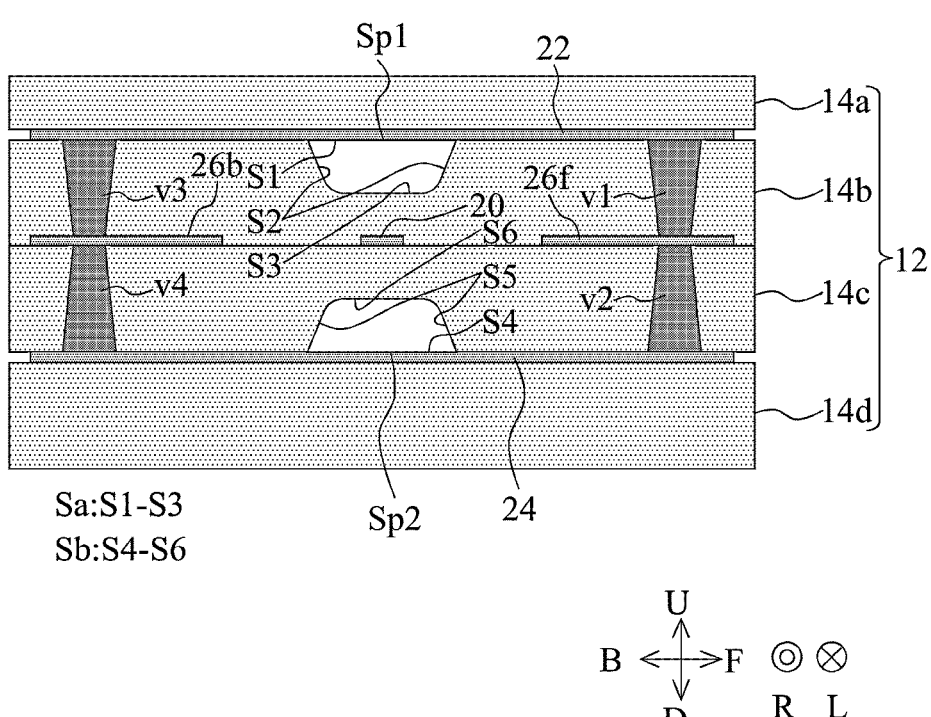
FIG. 6 is a cross-sectional view of a multilayer substrate 10b.

Hereinafter, a multilayer substrate 10b according to a second modification will be described with reference to the drawings. FIG. 6 is a cross-sectional view of the multilayer substrate 10b.

The multilayer substrate 10b is different from the multilayer substrate 10 in that boundaries between the bottom surface S3 and the side surfaces S2 in the hollow portion Sp1 are curved surfaces, and boundaries between the bottom surface S6 and the side surfaces S5 in the hollow portion Sp2 are curved surfaces. Since the other structure of the multilayer substrate 10b is the same as that of the multilayer substrate 10, description thereof will be omitted. The multilayer substrate 10b can achieve the same effects as the multilayer substrate 10.

In the multilayer substrate 10b, the boundaries between the bottom surface S3 and the side surfaces S2 are curved surfaces in the hollow portion Sp1. Therefore, when tensile stress is generated in the boundary portions between the bottom surface S3 and the side surfaces S2, the tensile stress is dispersed, and thus the multilayer substrate 10b is less likely to be damaged. In addition, as for compressive stress, since the stress is also dispersed, deformation of the hollow portion Sp1 can be reduced or prevented. Further, since the change in the dielectric constant becomes gentle, the reflection of the high-frequency signal can be reduced or prevented.

Third Modification

Figure 7:
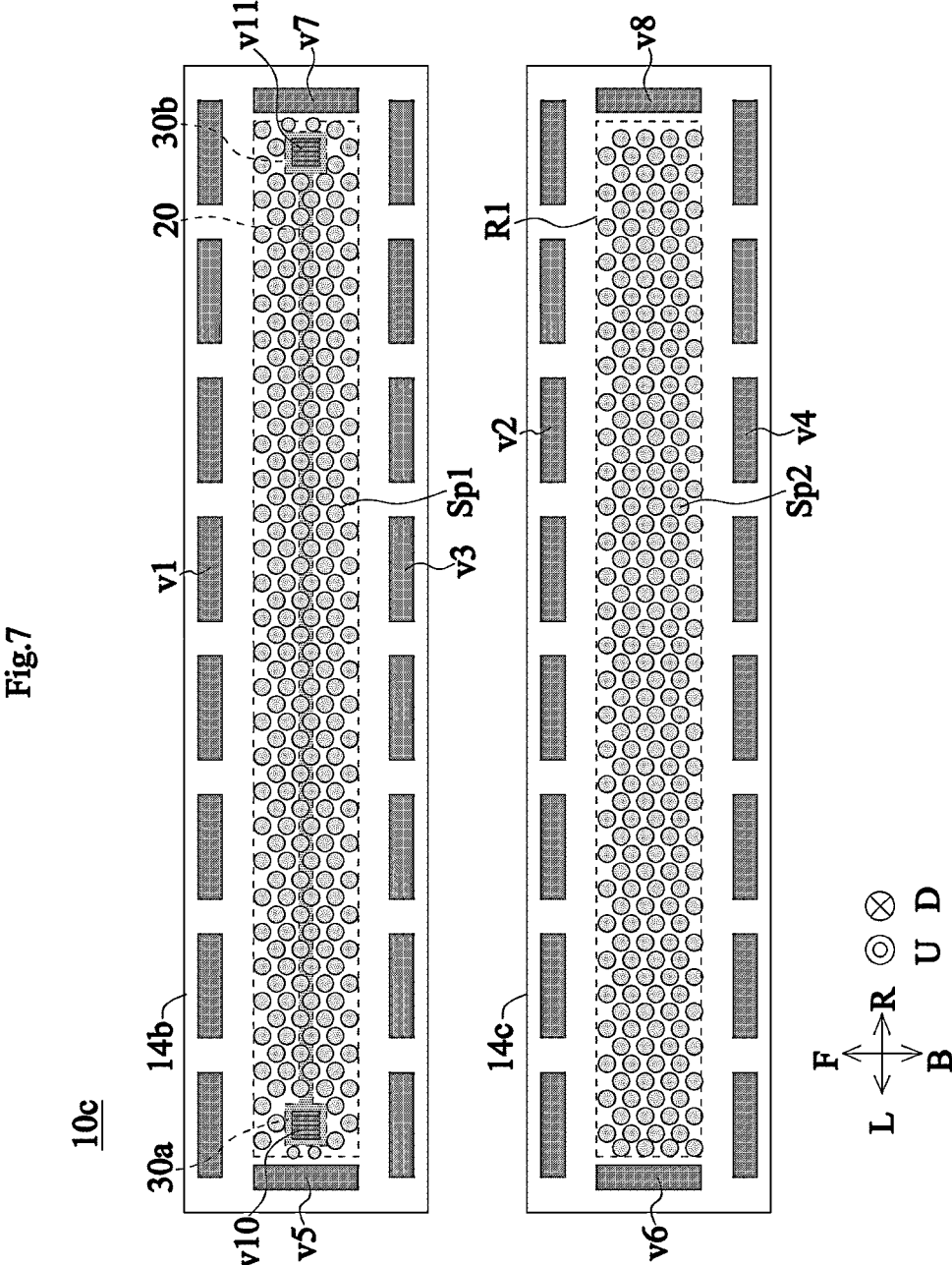
FIG. 7 is a top view of resin layers 14b and 14c of a multilayer substrate 10c.
Figure 8:
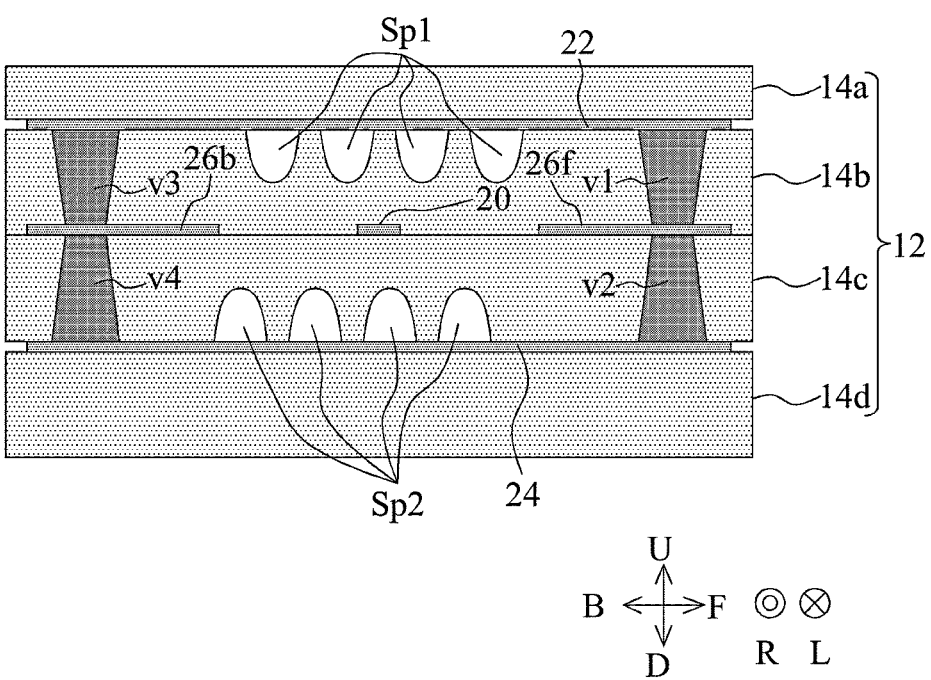
FIG. 8 is a cross-sectional view of the multilayer substrate 10c.
Figure 9:
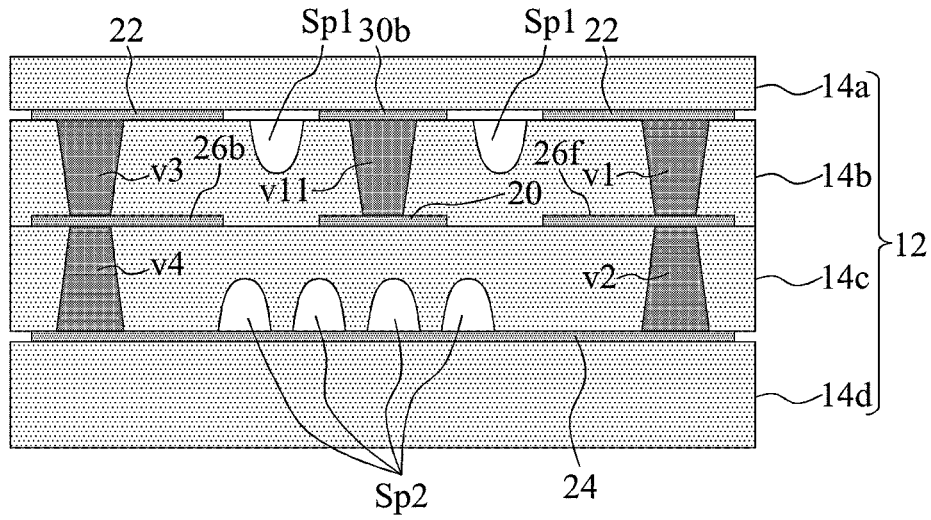
FIG. 9 is a cross-sectional view of the vicinity of a right end portion of the multilayer substrate 10c.
Figure 10:
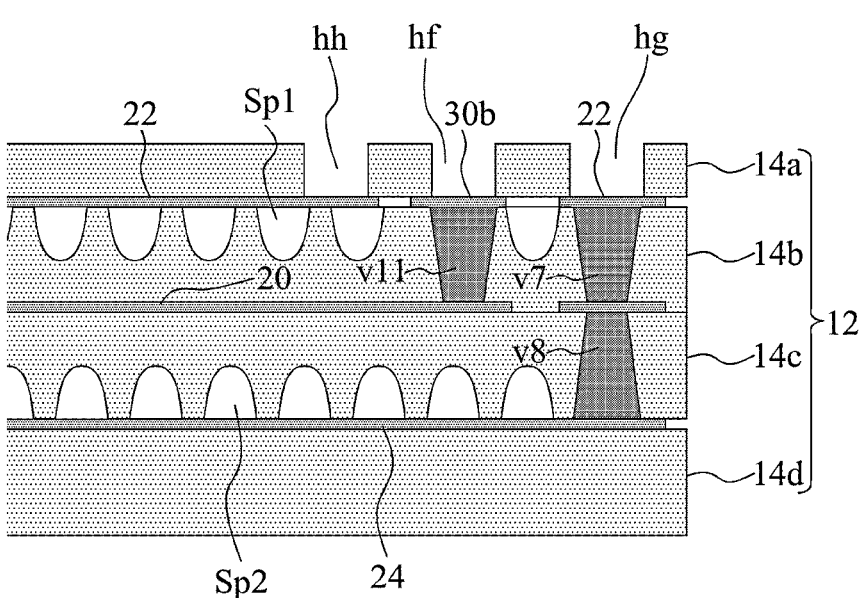
FIG. 10 is a cross-sectional view of the vicinity of the right end portion of the multilayer substrate 10c.

Hereinafter, a multilayer substrate 10c according to a third modification will be described with reference to the drawings. FIG. 7 is a top view of resin layers 14b and 14c of the multilayer substrate 10c. FIG. 8 is a cross-sectional view of the multilayer substrate 10c. FIG. 9 and FIG. 10 are cross-sectional views of the vicinity of a right end portion of the multilayer substrate 10c.

The multilayer substrate 10c is different from the multilayer substrate 10 in the shape of the hollow portions Sp1 and Sp2. More specifically, when viewed in the up-down direction (Z-axis direction), the maximum width of the hollow portion Sp1 is smaller than the maximum widths of the through conductors v1 and v3. In the present preferred embodiment, the plurality of hollow portions Sp1 has a circular shape when viewed in the up-down direction. Therefore, when viewed in the up-down direction, a diameter of the hollow portion Sp1 is shorter than the lengths of the through conductors v1 and v3 in the left-right direction. Thus, when viewed in the up-down direction, area of the hollow portion Sp1 is smaller than the areas of the through conductors v1 and v3. In the multilayer substrate 10c, the plurality of such small hollow portions Sp1 is uniformly dispersed around the signal conductor layer 20 when viewed in the up-down direction. In addition, when viewed in the up-down direction (Z-axis direction), the plurality of hollow portions Sp1 surrounds portions in which the signal conductor layer 20 and the outer electrodes 30a and 30b overlap each other.

When viewed in the up-down direction (Z-axis direction), the maximum width of the hollow portion Sp2 is smaller than the maximum widths of the through conductors v2 and v4. In the present preferred embodiment, the plurality of hollow portions Sp2 has a circular shape when viewed in the up-down direction. Therefore, when viewed in the up-down direction, a diameter of the hollow portion Sp2 is shorter than the lengths of the through conductors v2 and v4 in the left-right direction. Thus, when viewed in the up-down direction, area of the hollow portion Sp2 is smaller than the areas of the through conductors v2 and v4. In the multilayer substrate 10c, the plurality of such small hollow portions Sp2 is uniformly dispersed around the signal conductor layer 20 when viewed in the up-down direction. In addition, when viewed in the up-down direction (Z-axis direction), the plurality of hollow portions Sp2 surrounds portions in which the signal conductor layer 20 and the outer electrodes 30a and 30b overlap each other. Since the other structure of the multilayer substrate 10c is the same as that of the multilayer substrate 10, description thereof will be omitted. The multilayer substrate 10c can achieve the same effects as the multilayer substrate 10.

A total volume of the plurality of hollow portions Sp1 of the multilayer substrate 10c is smaller than a total volume of the hollow portions Sp1 of the multilayer substrate 10. Therefore, a decrease in the strength of the multilayer body 12 due to the provision of the plurality of hollow portions Sp1 is small. Therefore, the multilayer body 12 is less likely to be deformed. As a result, since the change in the structure around the signal conductor layer 20 is reduced, the characteristic impedance generated in the signal conductor layer 20 is less likely to fluctuate from the desired characteristic impedance.

In the multilayer substrate 10c, as illustrated in FIG. 10, the hollow portion Sp1 is located between the through conductor v7 and the through conductor v11. Accordingly, capacitive coupling between the through conductor v7 connected to the ground potential and the through conductor v11 through which the high-frequency signal is transmitted is reduced or prevented.

In the multilayer substrate 10c, a decrease in the strength of the multilayer body 12 is reduced or prevented. More specifically, the strength of a region R1 of the multilayer body 12 is reduced by providing the plurality of hollow portions Sp1 in the region R1 of the multilayer body 12. Thus, when viewed in the up-down direction, the plurality of through conductors v1, the plurality of through conductors v3, the through conductor v5, and the through conductor v7 surround the region R1 in which the plurality of hollow portions Sp1 is provided. The plurality of through conductors v1, the plurality of through conductors v3, the through conductor v5, and the through conductor v7 have high strength. Thus, a decrease in the strength of the multilayer body 12 is reduced or prevented.

In the multilayer substrate 10c, an interval between the plurality of through conductors v1 is larger than an interval between the plurality of hollow portions Sp1. Accordingly, a larger number of the plurality of hollow portions Sp1 are provided, and thus the dielectric constant around the signal conductor layer 20 decreases. As a result, according to the multilayer substrate 10c, the dielectric loss of the signal conductor layer 20 is reduced.

In the multilayer substrate 10c, the plurality of through conductors v1 is not in contact with the plurality of hollow portions Sp1. Thus, the conductor of the through conductor v1 is prevented from entering the hollow portion Sp1.

In the multilayer substrate 10c, the signal conductor layer 20 extends in the left-right direction. Therefore, the multilayer substrate 10c has a longitudinal direction in the left-right direction. In this case, the multilayer substrate 10c is highly likely to be bent at the broken line extending in the front-back direction. Thus, the plurality of through conductors v1 has long sides extending in the left-right direction. As such, the multilayer substrate 10c is prevented from being bent along the broken line extending in the front-back direction.

In the multilayer substrate 10c, lower end portions of the plurality of hollow portions Sp1 have curved surfaces protruding downward. Thus, a decrease in the strength of the multilayer body 12 is reduced or prevented. In addition, the characteristic impedance generated in the signal conductor layer 20 is less likely to fluctuate from the desired characteristic impedance.

In the multilayer substrate 10c, the diameters of the plurality of hollow portions Sp1 are equal to or less than about one eighth of the wavelength of the high-frequency signal transmitted through the signal conductor layer 20 when viewed in the up-down direction. Thus, for the same reason as in the case of the multilayer substrate 10a, noise emission from the multilayer substrate 10c is reduced or prevented.

In the multilayer substrate 10c, when viewed in the up-down direction (Z-axis direction), the plurality of hollow portions Sp1 surrounds portions in which the signal conductor layer 20 and the outer electrodes 30a overlap each other. As a result, fluctuation of the characteristic impedance generated in the vicinity of the outer electrode 30a from the desired characteristic impedance is reduced or prevented.

In the multilayer substrate 10c, the plurality of hollow portions Sp1 and the plurality of hollow portions Sp2 are formed, for example, on the upper main surface of the resin layer 14b or the lower main surface of the resin layer 14c by a drill.

Note that the hollow portion Sp1 does not overlap the hollow portion Sp2 when viewed in the up-down direction. However, the hollow portion Sp1 may overlap the hollow portion Sp2 when viewed in the up-down direction. When the hollow portion Sp1 does not overlap the hollow portion Sp2, a change in characteristic impedance is small and reflection can be reduced or prevented. In the case where the hollow portion Sp1 overlaps the hollow portion Sp2, since there is a resin-existing portion in the up-down direction, the strength of the multilayer substrate 10c is improved.

Fourth Modification

Figure 11:
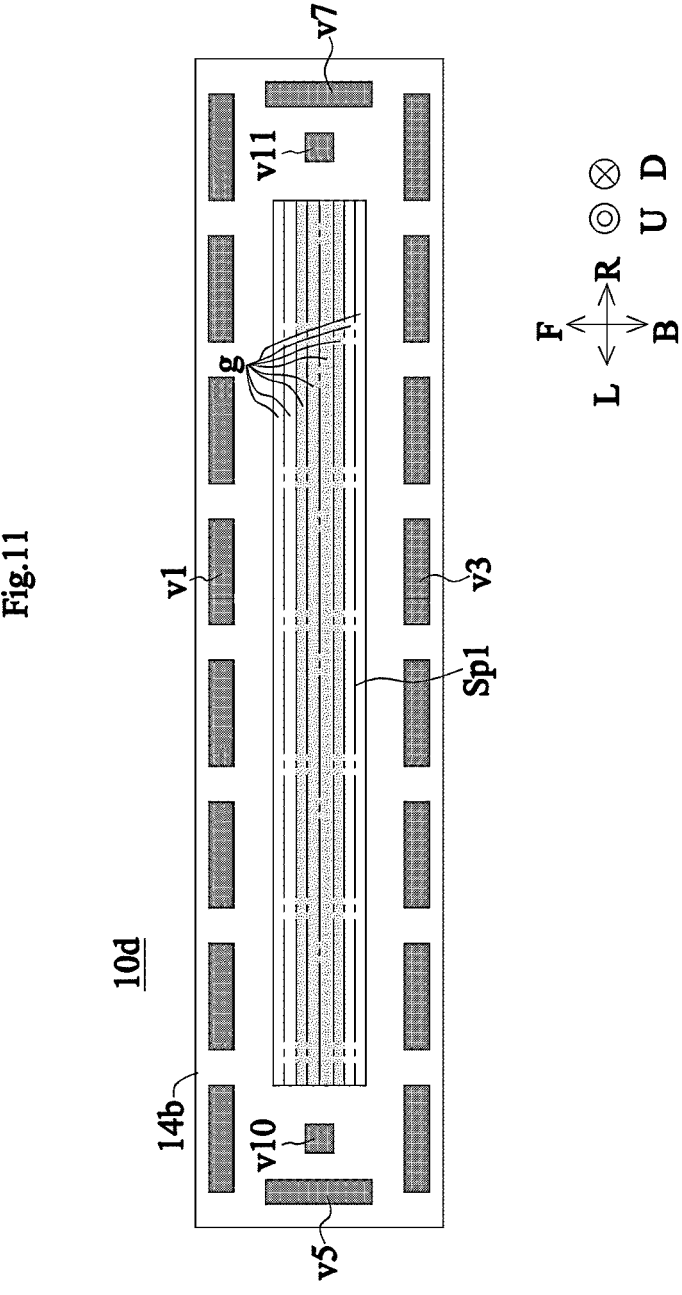
FIG. 11 is a top view of the resin layer 14b of a multilayer substrate 10d.
Figure 12:
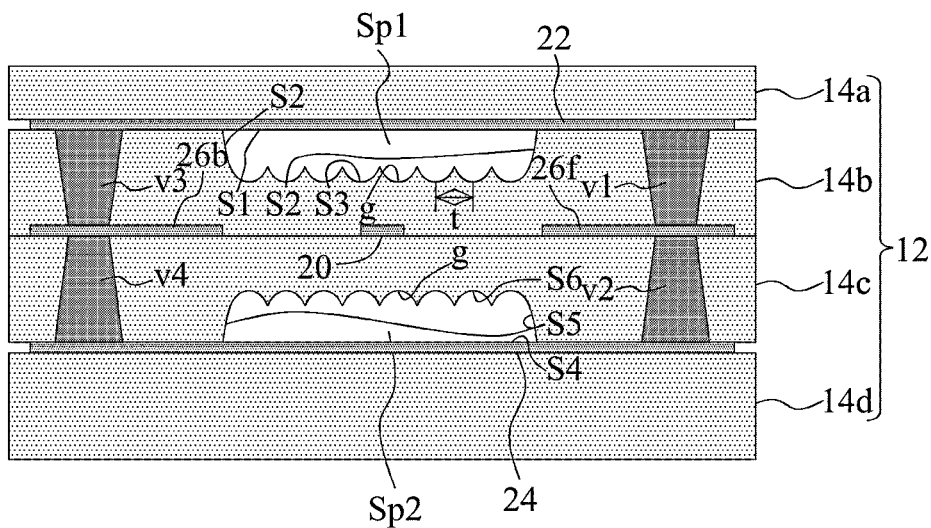
FIG. 12 is a cross-sectional view of the multilayer substrate 10d.

Hereinafter, a multilayer substrate according to a fourth modification will be described with reference to the drawings. FIG. 11 is a top view of a resin layer 14b of a multilayer substrate 10d. FIG. 12 is a cross-sectional view of the multilayer substrate 10d.

The multilayer substrate 10d is different from the multilayer substrate 10 in that unevenness is provided on the bottom surfaces S3 and S6. The bottom surfaces S3 and S6 are provided with a plurality of stripe-shaped depressions g arranged in the front-back direction. The stripe-shaped depression g extends in the left-right direction. Note that there may be a plurality of types of depths in the up-down direction of the stripe-shaped depression g. The bottom of the stripe-shaped depression g is a curved surface. A period t of the unevenness is equal to or less than about one eighth of the wavelength of a high-frequency signal transmitted through the signal conductor layer 20. Therefore, the period t of the unevenness is shorter than the length in the front-back direction and the length in the left-right direction of the through conductors v1 and v3. In addition, when the hollow portions Sp1 and Sp2 are formed by a drill or irradiation with a laser beam, such unevenness is formed on the bottom surfaces S3 and S6. Since the other structure of the multilayer substrate 10d is the same as that of the multilayer substrate 10, description thereof will be omitted. The multilayer substrate 10d can achieve the same effects as the multilayer substrate 10.

In addition, since the period t of the unevenness is equal to or less than about one eighth of the wavelength of the high-frequency signal transmitted through the signal conductor layer 20, the noise emission from the multilayer substrate 10d is reduced or prevented for the same reason as that of the multilayer substrate 10a. Further, the period t of the unevenness is shorter than the length in the front-back direction and the length in the left-right direction of the through conductors v1 and v3. Thus, a common drill can be used to form the hollow portions Sp1 and Sp2 and the through conductors v1 and v3.

In addition, since the plurality of depressions g extends in the left-right direction in a multilayer substrate 10d, the multilayer substrate 10f is prevented from being bent at the broken line extending in the front-back direction.

Fifth Modification

Figure 13:
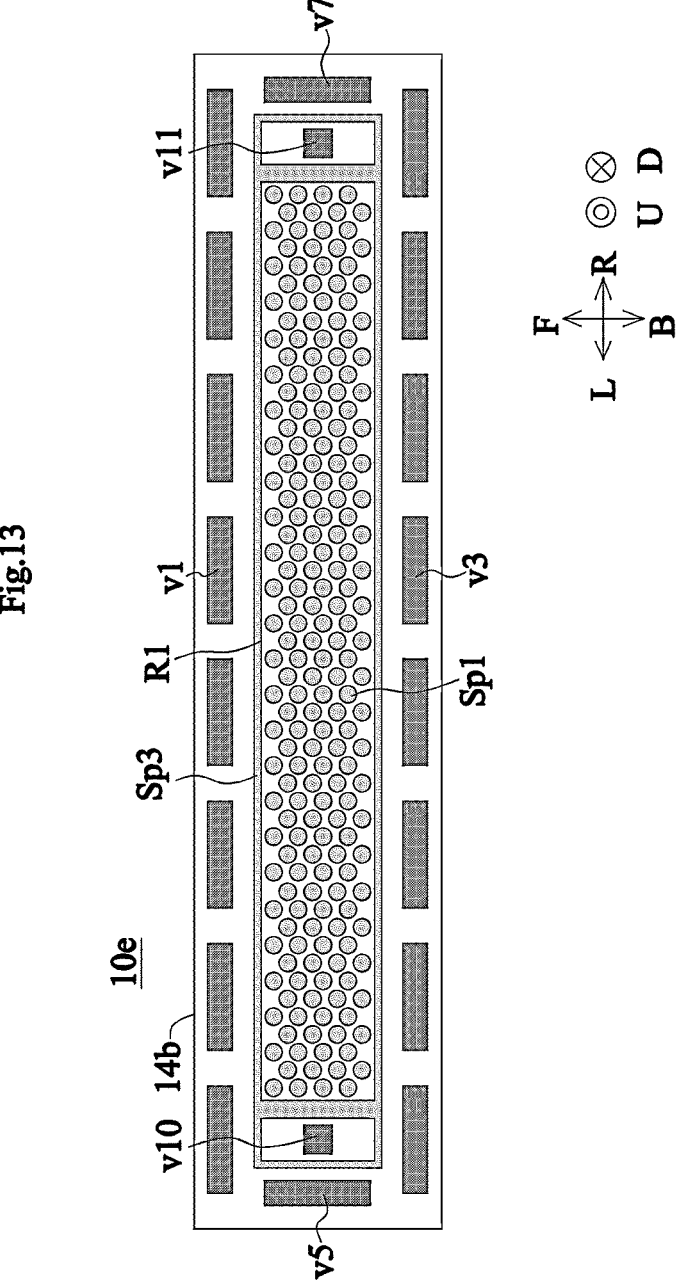
FIG. 13 is a top view of a resin layer 14b of a multilayer substrate 10e.

Hereinafter, a multilayer substrate 10e according to a fifth modification will be described with reference to the drawings. FIG. 13 is a top view of a resin layer 14b of the multilayer substrate 10e.

The multilayer substrate 10e is different from the multilayer substrate 10c in that an annular hollow portion Sp3 is provided in the resin layer 14b when viewed in the up-down direction. The annular hollow portion Sp3 surrounds the region R1 in which the plurality of hollow portions Sp1 is provided when viewed in the up-down direction. Thus, when viewed in the up-down direction (Z-axis direction), the hollow portion Sp3 extending in the left-right direction (X-axis direction) is located between the signal conductor layer 20 and the plurality of through conductors v1 and between the signal conductor layer 20 and the plurality of through conductors v3. In addition, the hollow portion Sp3 surrounds the through conductors v10 and v11 when viewed in the up-down direction. Since the other structure of the multilayer substrate 10e is the same as that of the multilayer substrate 10c, description thereof will be omitted. The multilayer substrate 10e can achieve the same effects as the multilayer substrate 10c.

In the multilayer substrate 10e, the hollow portion Sp3 extending in the left-right direction (X-axis direction) is located between the signal conductor layer 20 and the plurality of through conductors v1 and between the signal conductor layer 20 and the plurality of through conductors v3 when viewed in the up-down direction (Z-axis direction). Accordingly, solvents in the plurality of through conductors v1 and v3 are prevented from reaching the signal conductor layer 20, and thus corrosion of the signal conductor layer 20 is reduced or prevented.

Sixth Modification

Figure 14:
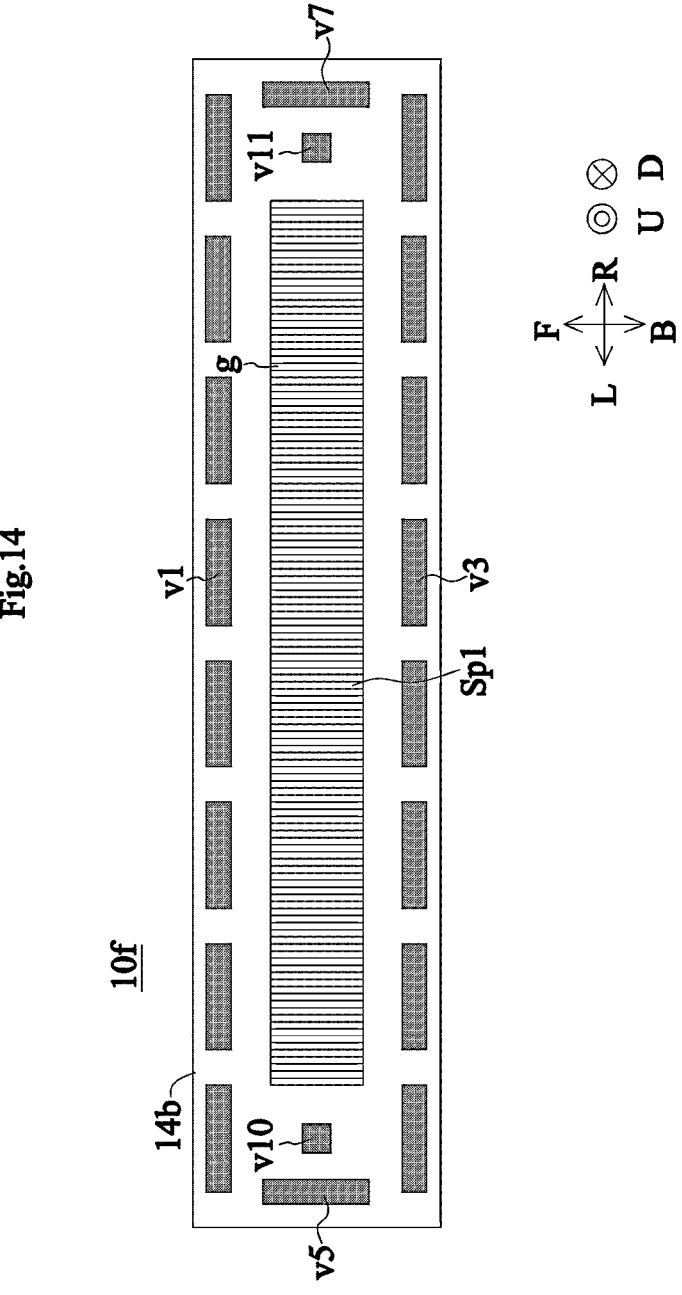
FIG. 14 is a top view of a resin layer 14b of a multilayer substrate 10f.

Hereinafter, the multilayer substrate 10f according to a sixth modification will be described with reference to the drawings. FIG. 14 is a top view of a resin layer 14b of the multilayer substrate 10f.

The multilayer substrate 10f is different from the multilayer substrate 10d in that a plurality of stripe-shaped depressions g extends in the front-back direction and is arranged in the left-right direction. Since the other structure of the multilayer substrate 10f is the same as that of the multilayer substrate 10d, description thereof will be omitted. The multilayer substrate 10f can achieve the same effects as the multilayer substrate 10d. In the multilayer substrate 10f, since the plurality of depressions g extends in the front-back direction, the multilayer substrate 10f is prevented from being bent at the broken line extending in the left-right direction.

Seventh Modification

Figure 15:
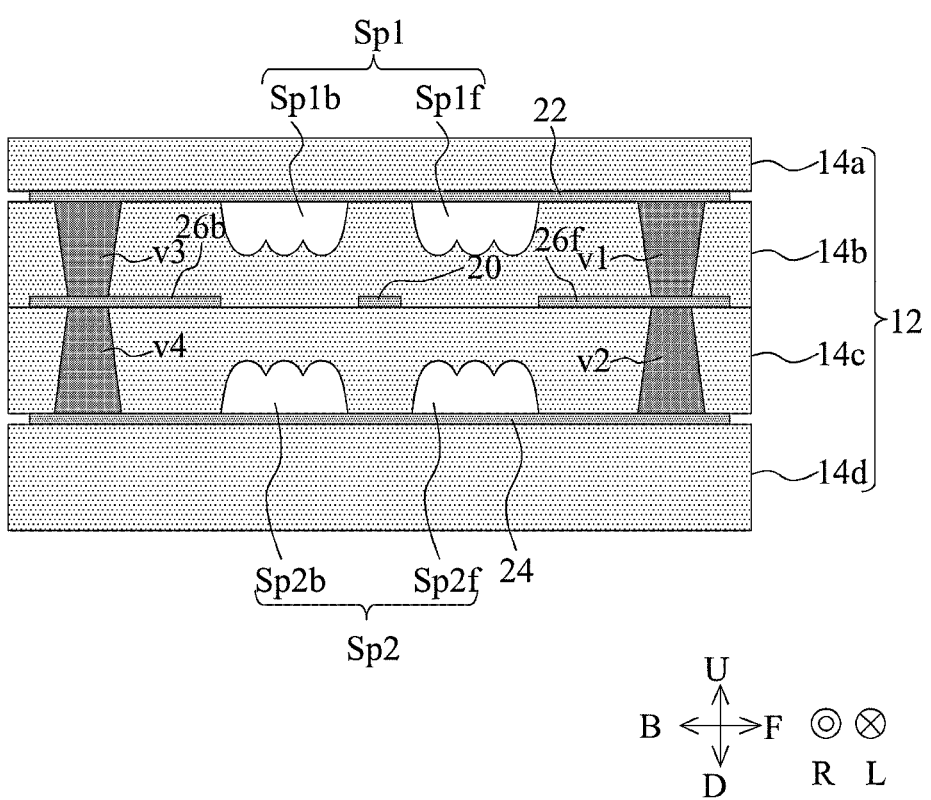
FIG. 15 is a cross-sectional view of a multilayer substrate 10g.

Hereinafter, a multilayer substrate 10g according to a seventh modification will be described with reference to the drawings. FIG. 15 is a cross-sectional view of the multilayer substrate 10g.

The multilayer substrate 10g is different from the multilayer substrate 10d in that the hollow portion Sp1 is divided into a hollow portion Sp1f and a hollow portion Sp1b and that the hollow portion Sp2 is divided into a hollow portion Sp2f and a hollow portion Sp2b. The hollow portion Sp1f and the hollow portion Sp1b are arranged in this order from the front to the back. The hollow portion Sp2f and the hollow portion Sp2b are arranged in this order from the front to the back. Since the other structure of the multilayer substrate 10g is the same as that of the multilayer substrate 10d, description thereof will be omitted. The multilayer substrate 10g can achieve the same effects as the multilayer substrate 10d.

In the multilayer substrate 10g, the resin layer 14b is present between the hollow portion Sp1f and the hollow portion Sp1b. As such, the strength of the multilayer body 12 is improved.

Eighth Modification

Figure 16:
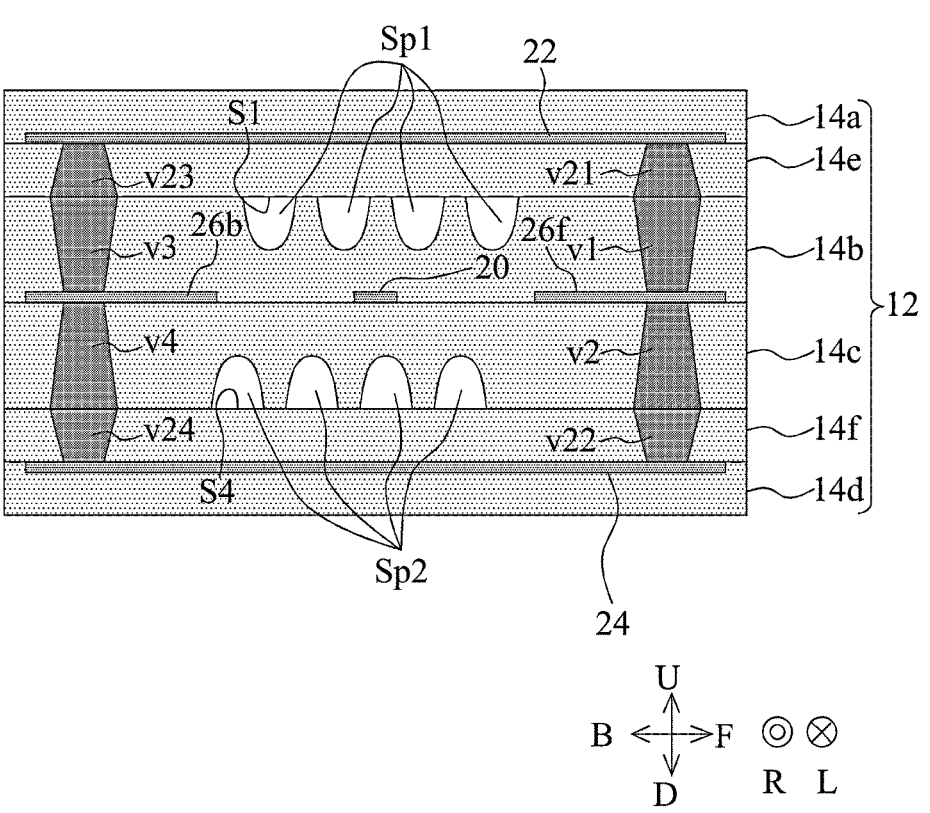
FIG. 16 is a cross-sectional view of a multilayer substrate 10h.

Hereinafter, a multilayer substrate 10h according to an eighth modification will be described with reference to the drawings. FIG. 16 is a cross-sectional view of the multilayer substrate 10h.

The multilayer substrate 10h is different from the multilayer substrate 10d in that the multilayer body 12 further includes resin layers 14e and 14f, and in that a plurality of through conductors v21, a plurality of through conductors v22, a plurality of through conductors v23, and a plurality of through conductors v24 are further provided. The resin layer 14e is located between the resin layer 14a and the resin layer 14b. Thus, a top surface S1 is a portion of a lower main surface (negative main surface) of the resin layer 14e (second resin layer) in contact with the upper main surface (positive main surface) of the resin layer 14b (first resin layer) of the resin layers 14a to 14f. Therefore, the first ground conductor layer 22 is not exposed to the hollow portion Sp1. The resin layer 14f is located between the resin layer 14c and the resin layer 14d. Thus, the top surface S4 is a portion of an upper main surface (positive main surface) of the resin layer 14f (second resin layer) in contact with the lower main surface (negative main surface) of the resin layer 14c (first resin layer) of the resin layers 14a to 14f. Therefore, the second ground conductor layer 24 is not exposed to the hollow portion Sp2.

Each of the plurality of through conductors v21 and the plurality of through conductors v23 passes through the resin layer 14e in the up-down direction. Each of the plurality of through conductors v21 electrically connects the first ground conductor layer 22 and the plurality of through conductors v1. Each of the plurality of through conductors v23 electrically connects the first ground conductor layer 22 and the plurality of through conductors v3. Each of the plurality of through conductors v22 and the plurality of through conductors v24 passes through the resin layer 14f in the up-down direction. Each of the plurality of through conductors v22 electrically connects the second ground conductor layer 24 and the plurality of through conductors v2. Each of the plurality of through conductors v24 electrically connects the second ground conductor layer 24 and the plurality of through conductors v4. Since the other structure of the multilayer substrate 10h is the same as that of the multilayer substrate 10d, description thereof will be omitted. The multilayer substrate 10h can achieve the same effects as the multilayer substrate 10d.

In the multilayer substrate 10h, since the first ground conductor layer 22 is not exposed to the hollow portion Sp1, corrosion of the first ground conductor layer 22 is reduced or prevented.

In the multilayer substrate 10h, a distance between the signal conductor layer 20 and the first ground conductor layer 22 is increased.

In the multilayer substrate 10h, the hollow portion Sp1 is provided in the resin layer 14b in contact with the signal conductor layer 20. Thus, since the hollow portion Sp1 is located near the signal conductor layer 20, the dielectric constant around the signal conductor layer 20 is reduced. As a result, the dielectric loss occurring in the multilayer substrate 10h is reduced.

Ninth Modification

Figure 17:
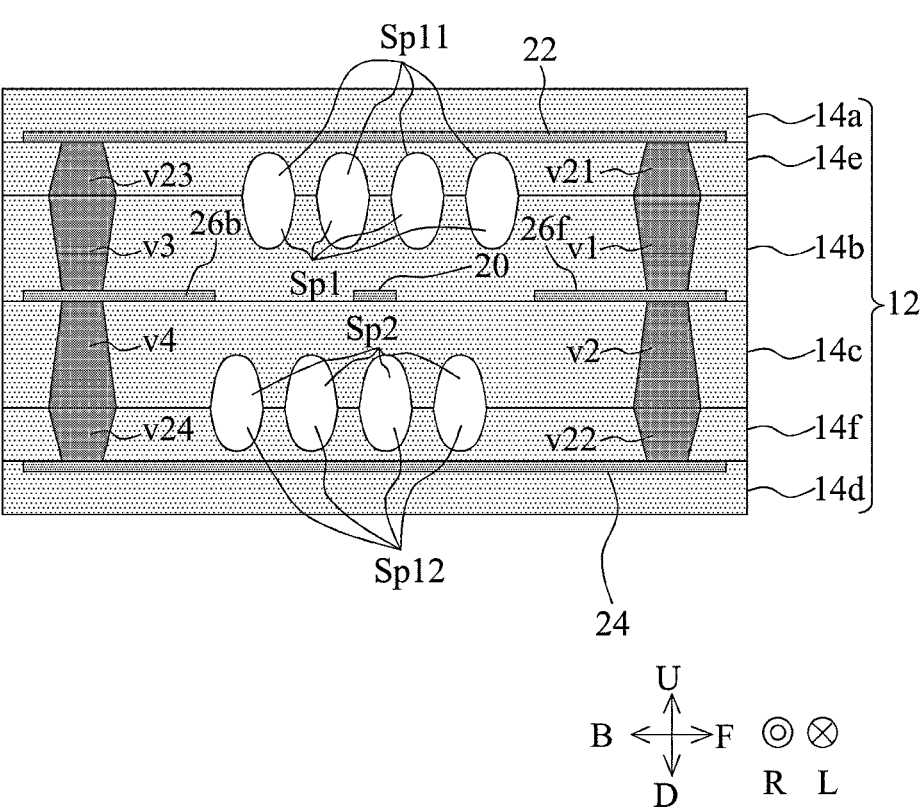
FIG. 17 is a cross-sectional view of a multilayer substrate 10i.

Hereinafter, a multilayer substrate 10i according to a ninth modification will be described with reference to the drawings. FIG. 17 is a cross-sectional view of the multilayer substrate 10i.

The multilayer substrate 10i is different from the multilayer substrate 10h in that a plurality of hollow portions Sp11 is provided in the resin layer 14e and that a plurality of hollow portions Sp12 is provided in the resin layer 14f. Each of the plurality of hollow portions Sp11 is connected to the plurality of hollow portions Sp1. Each of the plurality of hollow portions Sp12 is connected to the plurality of hollow portions Sp2. Since the other structure of the multilayer substrate 10i is the same as that of the multilayer substrate 10h, description thereof will be omitted. The multilayer substrate 10i can achieve the same effects as the multilayer substrate 10h.

Tenth Modification

Figure 18:
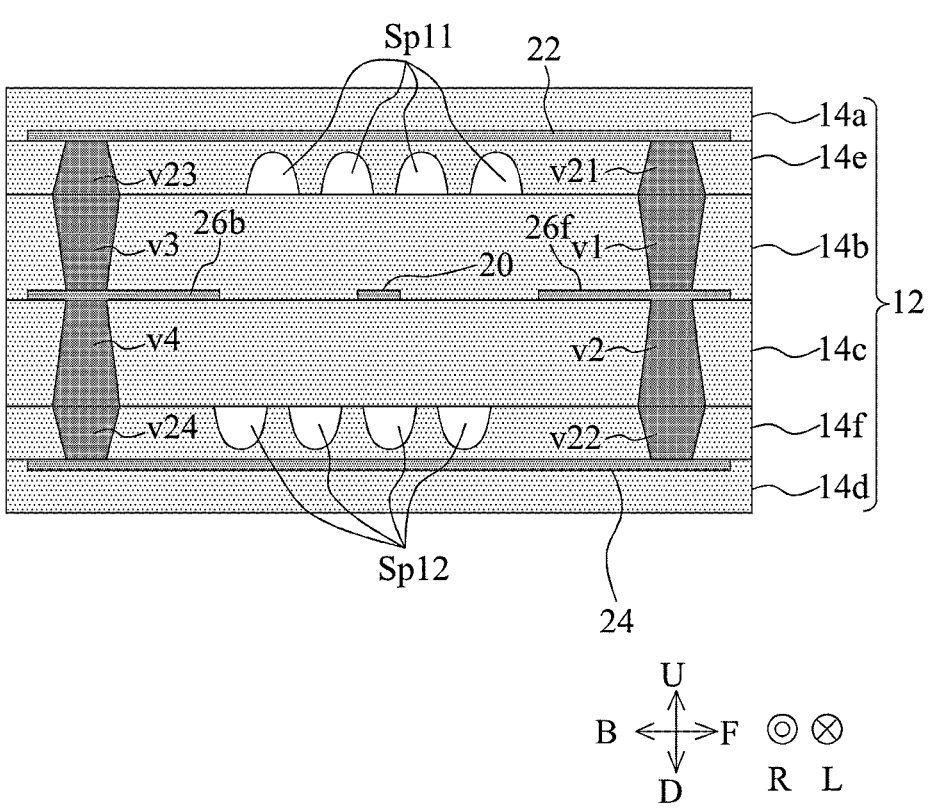
FIG. 18 is a cross-sectional view of a multilayer substrate 10j.

Hereinafter, a multilayer substrate 10j according to a tenth modification will be described with reference to the drawings. FIG. 18 is a cross-sectional view of the multilayer substrate 10j.

The multilayer substrate 10j is different from the multilayer substrate 10i in that the plurality of hollow portions Sp1 and the plurality of hollow portions Sp2 are not provided. In this case, the plurality of hollow portions Sp11 functions as a plurality of first hollow portions. The plurality of hollow portions Sp12 functions as a plurality of second hollow portions. Since the other structure of the multilayer substrate 10j is the same as that of the multilayer substrate 10i, description thereof will be omitted. The multilayer substrate 10j can achieve the same effects as the multilayer substrate 10i.

Eleventh Modification

Figure 19:
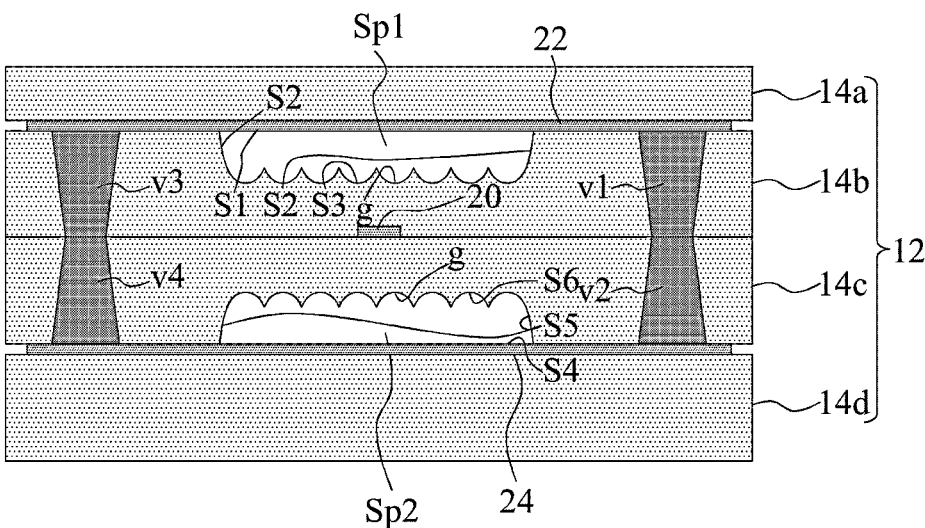
FIG. 19 is a cross-sectional view of a multilayer substrate 10k.

Hereinafter, a multilayer substrate 10k according to an eleventh modification will be described with reference to the drawings. FIG. 19 is a cross-sectional view of the multilayer substrate 10k.

The multilayer substrate 10k is different from the multilayer substrate 10d in that the third ground conductor layer 26 is not provided. Since the other structure of the multilayer substrate 10k is the same as that of the multilayer substrate 10d, description thereof will be omitted. The multilayer substrate 10k can achieve the same effects as the multilayer substrate 10c.

Twelfth Modification

Figure 20:
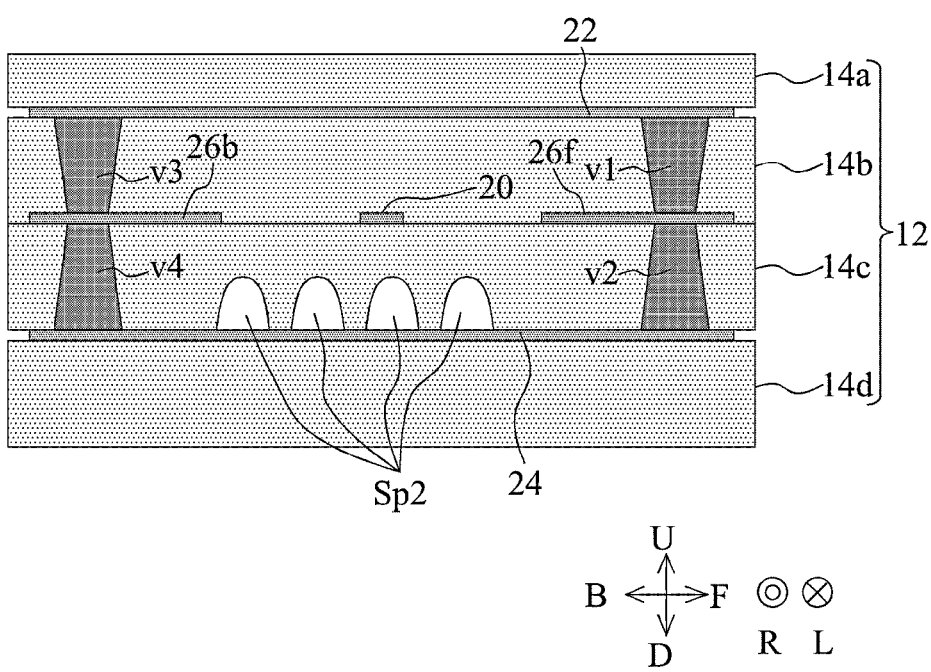
FIG. 20 is a cross-sectional view of a multilayer substrate 10l.

Hereinafter, a multilayer substrate 10l according to a twelfth modification will be described with reference to the drawings. FIG. 20 is a cross-sectional view of the multilayer substrate 10l.

The multilayer substrate 10l is different from the multilayer substrate 10c in that the plurality of hollow portions Sp1 is not provided. Since the other structure of the multilayer substrate 10l is the same as that of the multilayer substrate 10c, description thereof will be omitted. The multilayer substrate 10l can achieve the same effects as the multilayer substrate 10c.

In the multilayer substrate 10l, the plurality of hollow portions Sp2 functions as a plurality of first hollow portions. In this case, the positive direction of the Z axis is the upward direction. The negative direction of the Z axis is the downward direction.

In the multilayer substrate 10l, since the plurality of hollow portions Sp1 is not provided in the resin layer 14b, the strength of the multilayer body 12 is improved.

In the multilayer substrate 10l, since the plurality of hollow portions Sp1 is not provided in the resin layer 14b, wiring or the like can be provided in the portion designed for the plurality of hollow portions Sp1. As a result, the design flexibility of the multilayer substrate 10l is improved.

Thirteenth Modification

Figure 21:
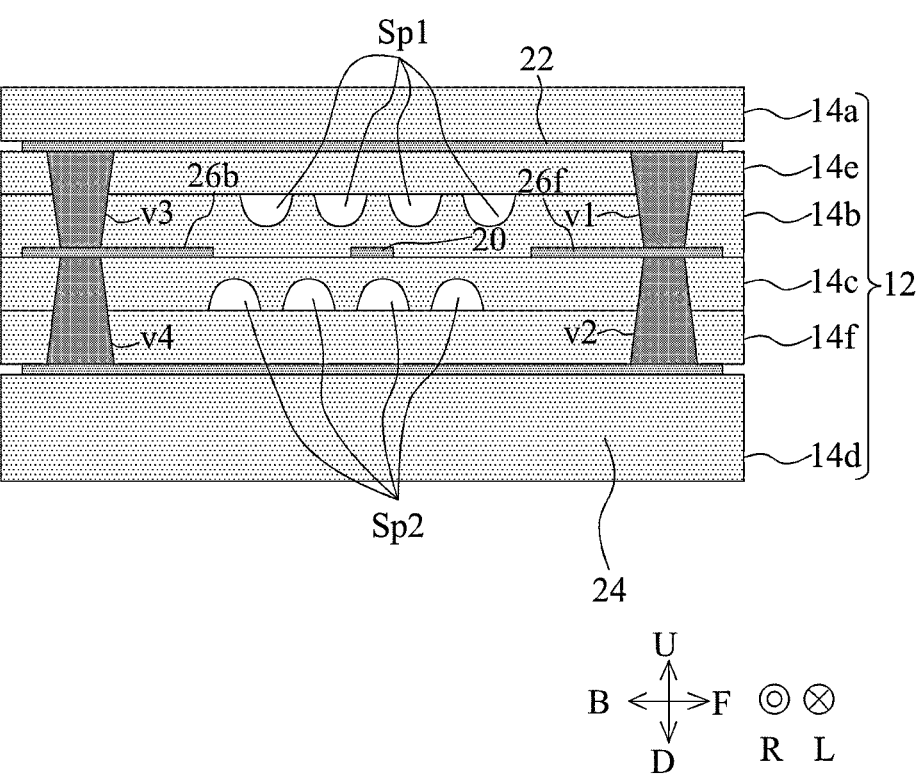
FIG. 21 is a cross-sectional view of a multilayer substrate 10m.

Hereinafter, a multilayer substrate 10m according to a thirteenth modification will be described with reference to the drawings. FIG. 21 is a cross-sectional view of the multilayer substrate 10m.

The multilayer substrate 10m is different from the multilayer substrate 10h in the structure of the through conductors. More specifically, the multilayer substrate 10m does not include the plurality of through conductors v21, the plurality of through conductors v22, the plurality of through conductors v23, and the plurality of through conductors v24. Instead, the plurality of through conductors v1 and the plurality of through conductors v3 pass through the resin layers 14*b* and 14*e* in the up-down direction. The plurality of through conductors v2 and the plurality of through conductors v4 pass through the resin layers 14*c* and 14*f* in the up-down direction. Since the other structure of the multilayer substrate 10*m* is the same as that of the multilayer substrate 10*h*, description thereof will be omitted. The multilayer substrate 10*m* can achieve the same effects as the multilayer substrate 10*h*.

In the multilayer substrate 10*m*, after the resin layers 14*b* and 14*e* are stacked, through-holes are formed in the resin layers 14*b* and 14*e*. Thereafter, the plurality of through conductors v1 and the plurality of through conductors v3 are formed by filling the through-holes with a conductive paste and solidifying the conductive paste by heating and pressurization. Note that the plurality of through conductors v1 and the plurality of through conductors v3 may be formed by plating. Accordingly, the plurality of through conductors v1 and the plurality of through conductors v3 can be formed in a state where the plurality of hollow portions Sp1 is sealed.

In the multilayer substrate 10*m*, since the plurality of through conductors v1 and the plurality of through conductors v3 pass through the resin layers 14*b* and 14*e* in the up-down direction, the occurrence of peeling between the resin layer 14*b* and the resin layer 14*c* is reduced or prevented.

Fourteenth Modification

Figure 22:
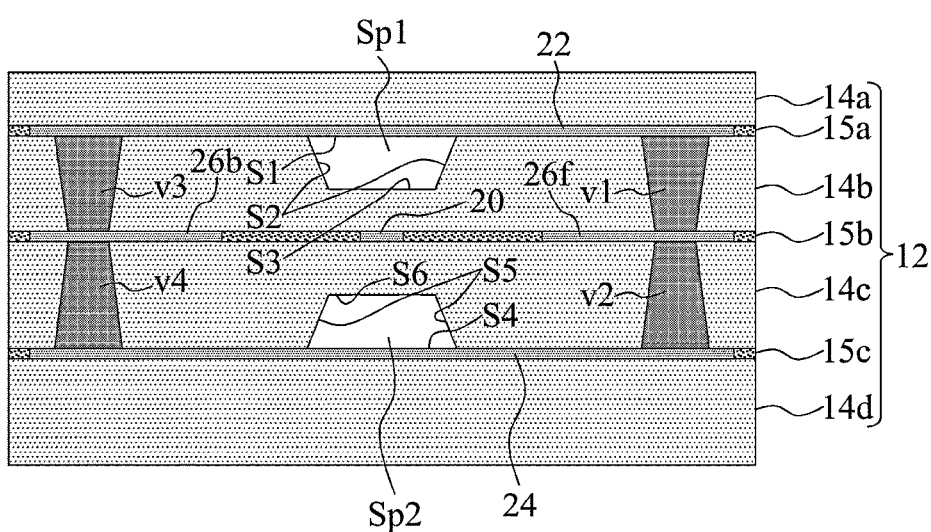
FIG. 22 is a cross-sectional view of a multilayer substrate 10n.

Hereinafter, a multilayer substrate 10*n* according to a fourteenth modification will be described with reference to the drawings. FIG. 22 is a cross-sectional view of the multilayer substrate 10*n*.

The multilayer substrate 10*n* is different from the multilayer substrate 10 in that the multilayer body 12 includes adhesive layers 15*a* to 15*c*. The resin layers 14*a* to 14*d* adjacent to each other in the up-down direction (Z-axis direction) are fixed to each other by the adhesive layers 15*a* to 15*c*. To be specific, the adhesive layer 15*a* adheres to the resin layer 14*a* and the resin layer 14*b*. The adhesive layer 15*b* adheres to the resin layer 14*b* and the resin layer 14*c*. The adhesive layer 15*c* adheres to the resin layer 14*c* and the resin layer 14*d*. Note that adhesive layers may also be present on and under the signal conductor layer 20. In addition, the adhesive layer 15*a* may be provided entirely between the resin layer 14*a* and the resin layer 14*b*. The adhesive layer 15*b* may be provided entirely between the resin layer 14*b* and the resin layer 14*c*. The adhesive layer 15*c* may be provided entirely between the resin layer 14*c* and the resin layer 14*d*. Since the other structure of the multilayer substrate 10*n* is the same as that of the multilayer substrate 10, a description thereof will be omitted. The multilayer substrate 10*n* can achieve the same effects as the multilayer substrate 10. Note that although no adhesive layer is present between the conductor layer and the resin layer in the multilayer substrate 10*n*, an adhesive layer may be present between the conductor layer and the resin layer.

In the multilayer substrate 10*n*, the resin layers 14*a* to 14*d* adjacent to each other in the up-down direction (Z-axis direction) are fixed to each other by the adhesive layers 15*a* to 15*c*. Therefore, the material of the resin layers 14*a* to 14*d* may be resin other than the thermoplastic resin. As a result, options for the material of the resin layers 14*a* to 14*d* increase.

Fifteenth Modification

Figure 23:
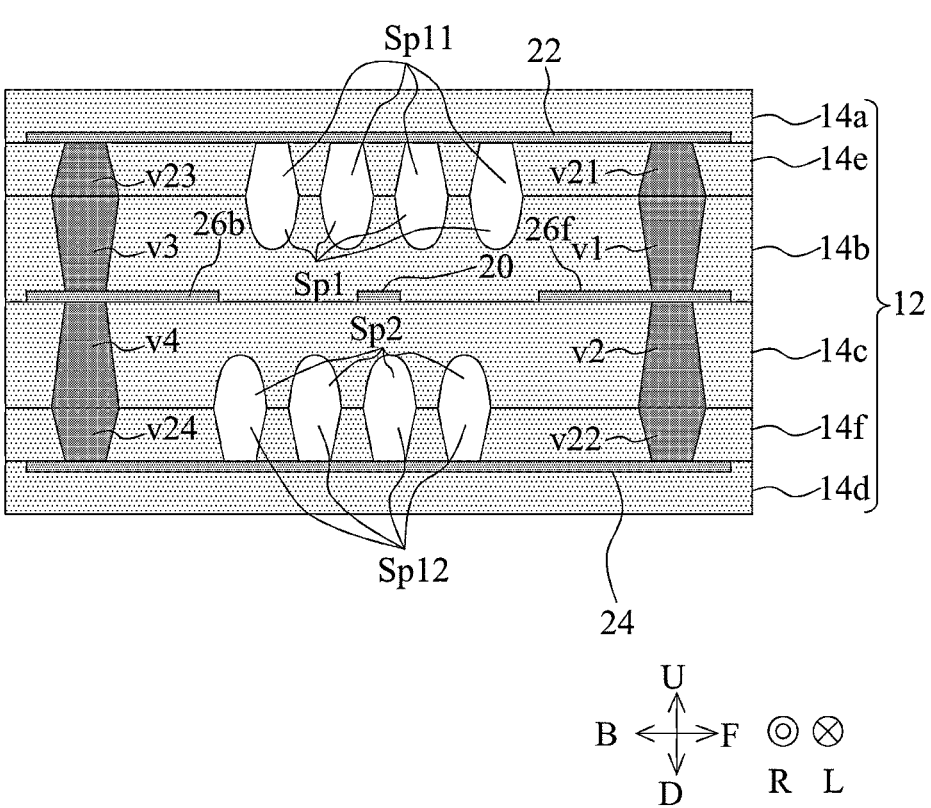
FIG. 23 is a cross-sectional view of a multilayer substrate 10o.

Hereinafter, a multilayer substrate 10*o* according to a fifteenth modification will be described with reference to the drawings. FIG. 23 is a cross-sectional view of the multilayer substrate 10*o*.

The multilayer substrate 10*o* is different from the multilayer substrate 10*i* in the shape of the plurality of hollow portions Sp11 and Sp12. In the multilayer substrate 10*o*, the plurality of hollow portions Sp11 passes through the resin layer 14*e* in the up-down direction. The plurality of hollow portions Sp12 passes through the resin layer 14*f* in the up-down direction. Since the other structure of the multilayer substrate 10*o* is the same as that of the multilayer substrate 10*i*, description thereof will be omitted. The multilayer substrate 10*o* can achieve the same effects as the multilayer substrate 10*i*. In addition, since the hollow portions Sp11 and Sp12 are large, the dielectric constant around the signal conductor layer 20 is low. As a result, the transmission loss generated in the signal conductor layer 20 is small.

Sixteenth Modification

Figure 24:
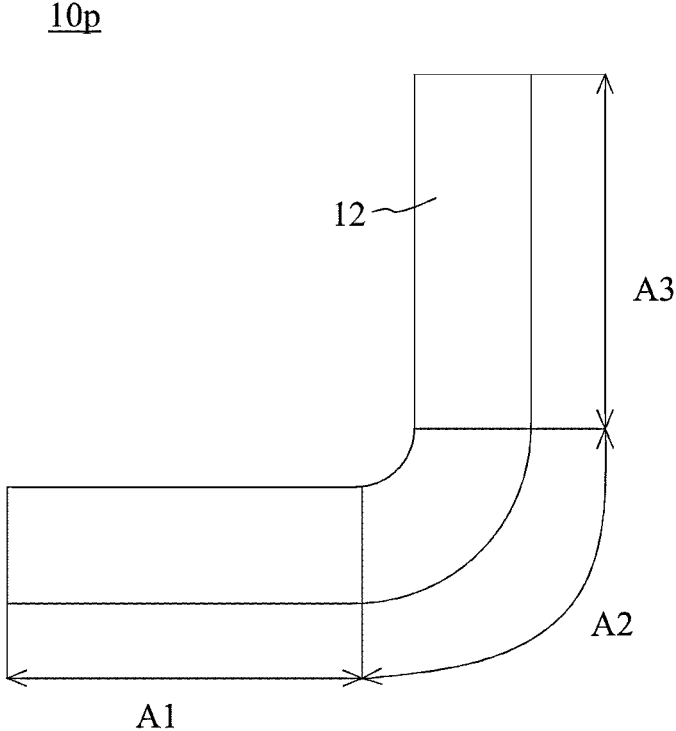
FIG. 24 is a front view of a multilayer substrate 10p.
Figure 25:
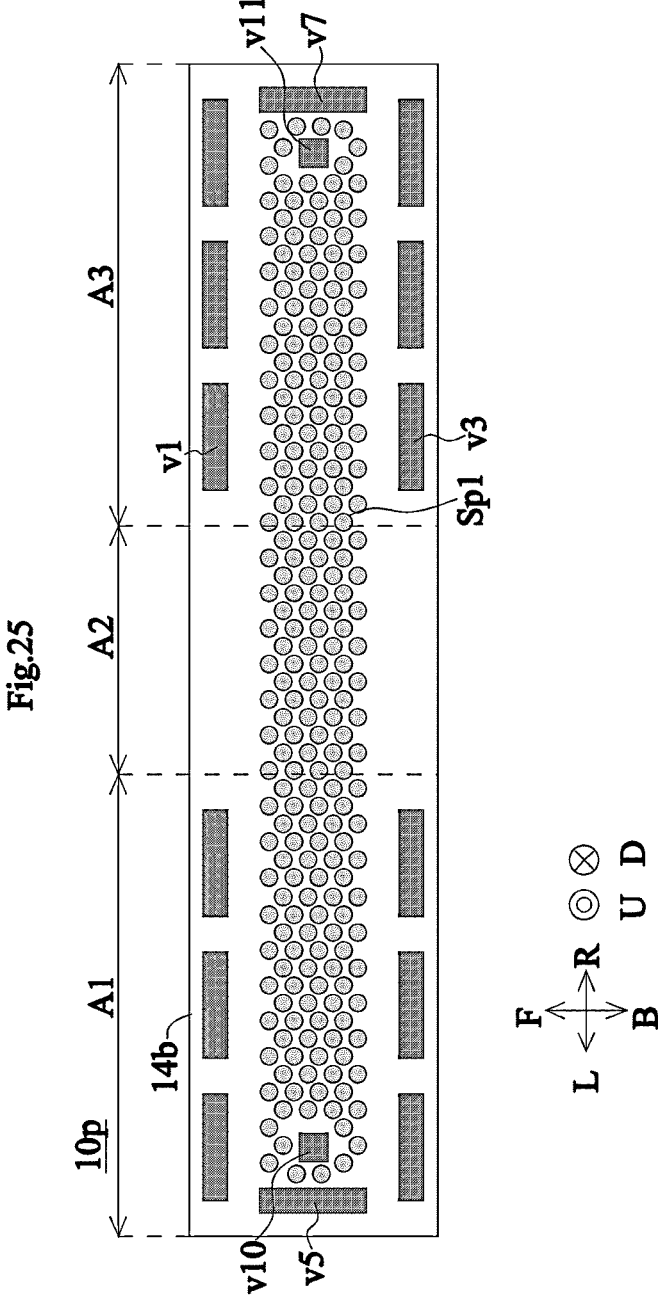
FIG. 25 is a top view of a resin layer 14b of the multilayer substrate 10p.

Hereinafter, a multilayer substrate 10*p* according to a sixteenth modification will be described with reference to the drawings. FIG. 24 is a front view of the multilayer substrate 10*p*. FIG. 25 is a top view of a resin layer 14*b* of the multilayer substrate 10*p*.

The multilayer substrate 10*p* is different from the multilayer substrate 10*c* in that the multilayer body 12 is bent in the up-down direction. The multilayer body 12 has first sections A1 and A3 and a second section A2. The first section A1, the second section A2, and the first section A3 are arranged in this order from left to right. The second section A2 is bent such that a radius of curvature of the second section A2 is smaller than the radii of curvature of the first sections A1 and A3. Note that the multilayer substrates 10 and 10*a* to 10*n* may be bent like the multilayer substrate 10*p*.

In addition, the multilayer substrate 10*p* is different from the multilayer substrate 10*c* in that the through conductors v1 to v4 are not provided in the second section A2. Accordingly, the second section A2 is easily bent. Since the other structure of the multilayer substrate 10*p* is the same as that of the multilayer substrate 10*c*, description thereof will be omitted. The multilayer substrate 10*p* can achieve the same effects as the multilayer substrate 10*c*.

Seventeenth Modification

Figure 26:
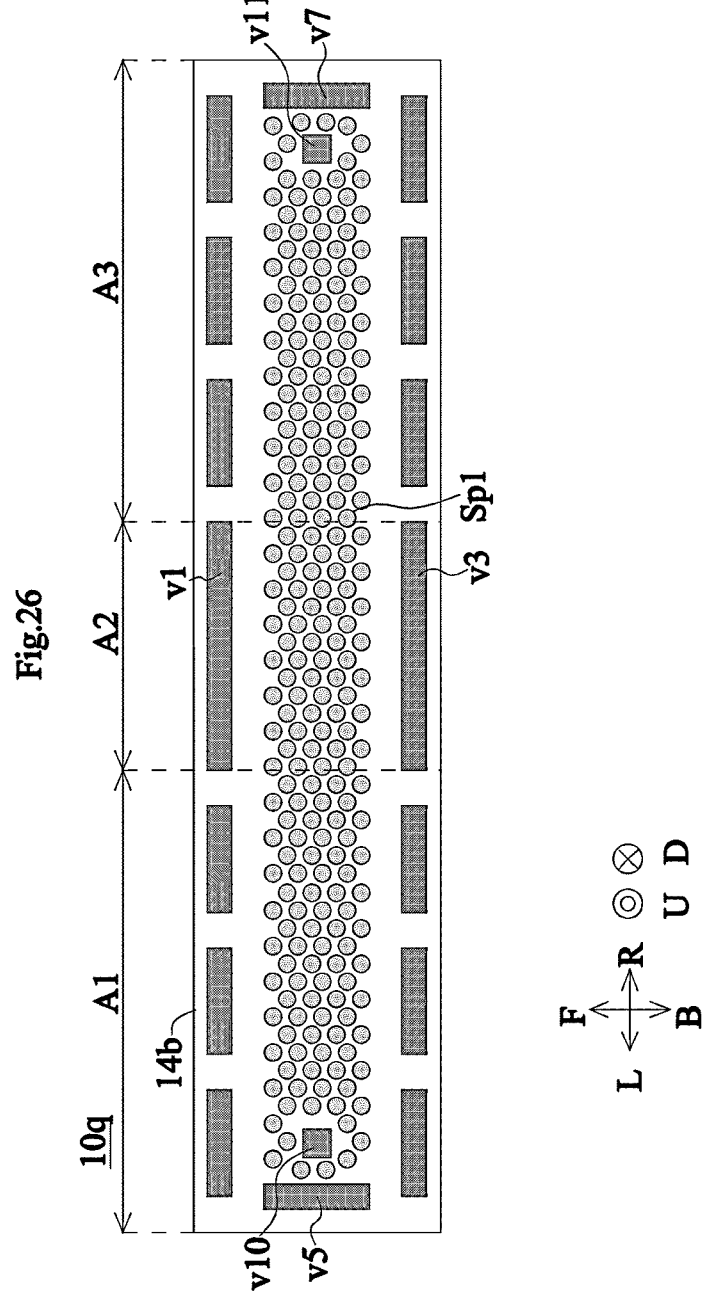
FIG. 26 is a cross-sectional view of a resin layer 14b of a multilayer substrate 10q.

Hereinafter, a multilayer substrate 10*q* according to a seventeenth modification will be described with reference to the drawings. FIG. 26 is a cross-sectional view of a resin layer 14*b* of the multilayer substrate 10*q*.

The multilayer substrate 10*q* is different from the multilayer substrate 10*p* in that the through conductors v1 to v4 are provided in the second section A2. The through conductors v1 to v4 continuously extend in the left-right direction between a left end and a right end of the second section A2. Thus, by plastically deforming the through conductors v1 to v4 in the second section A2, the second section A2 can be maintained in a bent state. Since the other structure of the multilayer substrate 10*q* is the same as that of the multilayer substrate 10*p*, description thereof will be omitted.

Eighteenth Modification

Figure 27:
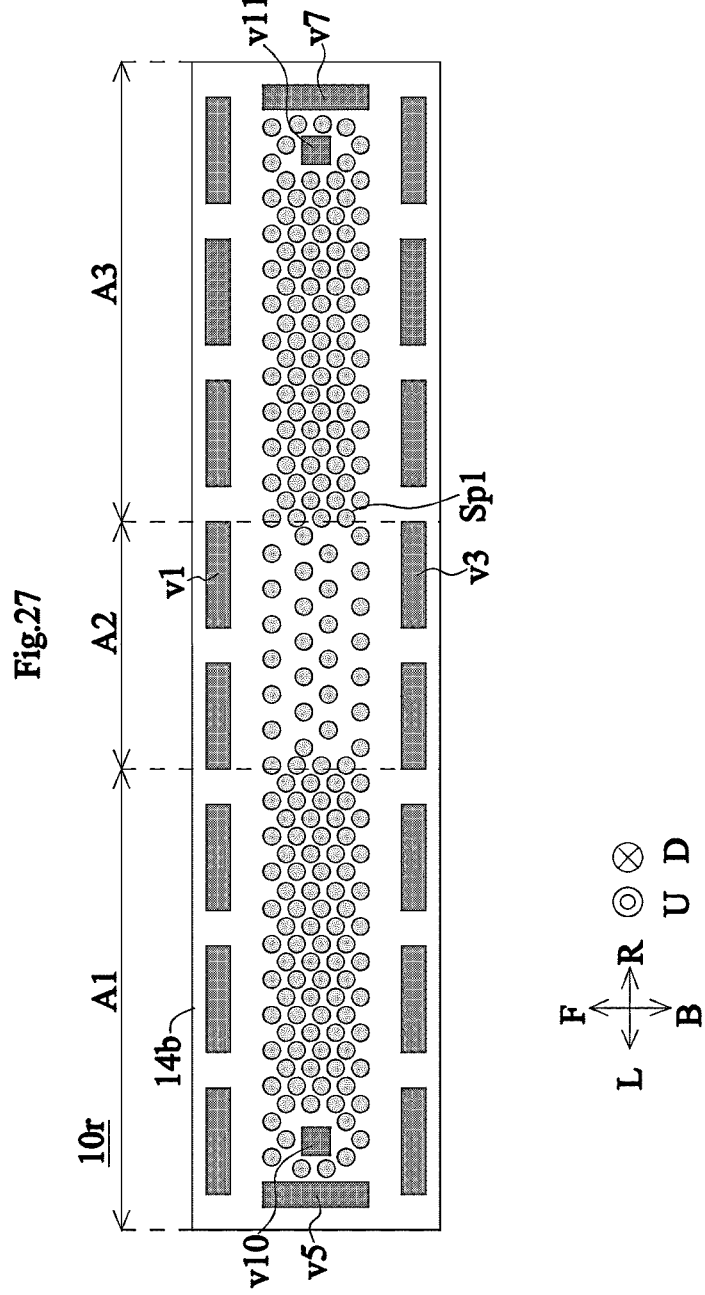
FIG. 27 is a cross-sectional view of a resin layer 14b of a multilayer substrate 10r.

Hereinafter, a multilayer substrate 10*r* according to an eighteenth modification will be described with reference to the drawings. FIG. 27 is a cross-sectional view of a resin layer 14*b* of the multilayer substrate 10*r*.

The multilayer substrate 10*r* is different from the multilayer substrate 10*c* in the structure of the plurality of hollow portions Sp1 in the second section A2. When viewed in the up-down direction, the number of hollow portions Sp1 per unit area in the second section A2 is smaller than the number of hollow portions Sp1 per unit area in the first sections A1 and A3. Thus, the proportion of air in the second section A2 is lower than the proportion of air in the first sections A1 and A3. Since the other structure of the multilayer substrate 10*r* is the same as that of the multilayer substrate 10*c*, description thereof will be omitted. The multilayer substrate 10*r* can achieve the same effects as the multilayer substrate 10*c*.

In the multilayer substrate 10*r*, the proportion of air in the second section A2 is lower than the proportion of air in the first sections A1 and A3. Accordingly, when the second section A2 is bent, deformation of the plurality of hollow portions Sp1 is reduced or prevented.

A line width of the signal conductor layer 20 in the second section A2 may be narrower than a line width of the signal conductor layer 20 in the first sections A1 and A3. As a result, the characteristic impedance generated in the signal conductor layer 20 in the second section A2 approaches the characteristic impedance generated in the signal conductor layer 20 in the first sections A1 and A3.

Nineteenth Modification

Figure 28:
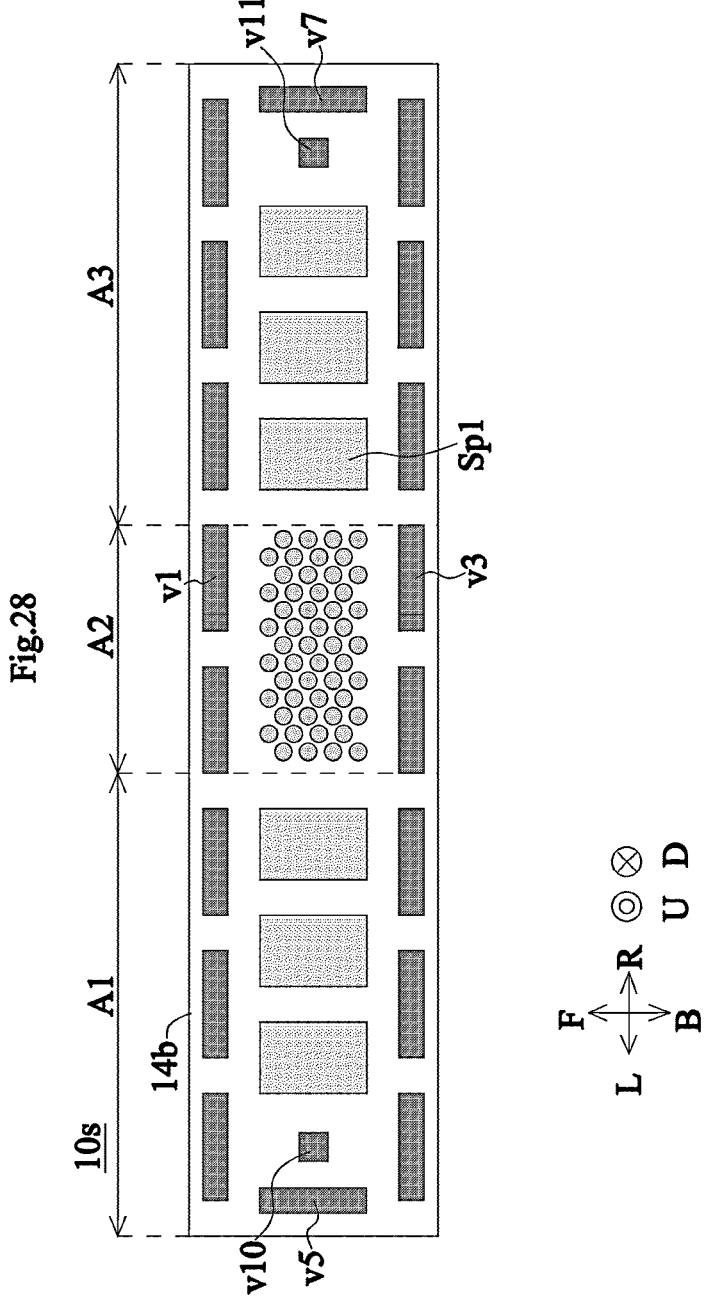
FIG. 28 is a cross-sectional view of a resin layer 14b of a multilayer substrate 10s.

Hereinafter, a multilayer substrate 10*s* according to a nineteenth modification will be described with reference to the drawings. FIG. 28 is a cross-sectional view of a resin layer 14*b* of the multilayer substrate 10*s*.

The multilayer substrate 10*s* is different from the multilayer substrate 10*c* in that the shape of the plurality of hollow portions Sp1 in the first sections A1 and A3 is different from the shape of the plurality of hollow portions Sp1 in the second section A2. In the multilayer substrate 10*s*, the plurality of hollow portions Sp1 in the first sections A1 and A3 has a large rectangular or substantially rectangular shape when viewed in the up-down direction. The plurality of hollow portions Sp2 in the second section A2 has a small circular shape when viewed in the up-down direction. Since the other structure of the multilayer substrate 10*s* is the same as that of the multilayer substrate 10*c*, description thereof will be omitted. The multilayer substrate 10*s* can achieve the same effects as the multilayer substrate 10*c*.

In the multilayer substrate 10*s*, the plurality of hollow portions Sp1 in the first sections A1 and A3 has a large rectangular or substantially rectangular shape when viewed in the up-down direction. As a result, the dielectric constant in the vicinity of the signal conductor layer 20 decreases in the first sections A1 and A3. As a result, the dielectric loss in the first sections A1 and A3 of the multilayer substrate 10*s* is reduced.

Twentieth Modification

Figure 29:
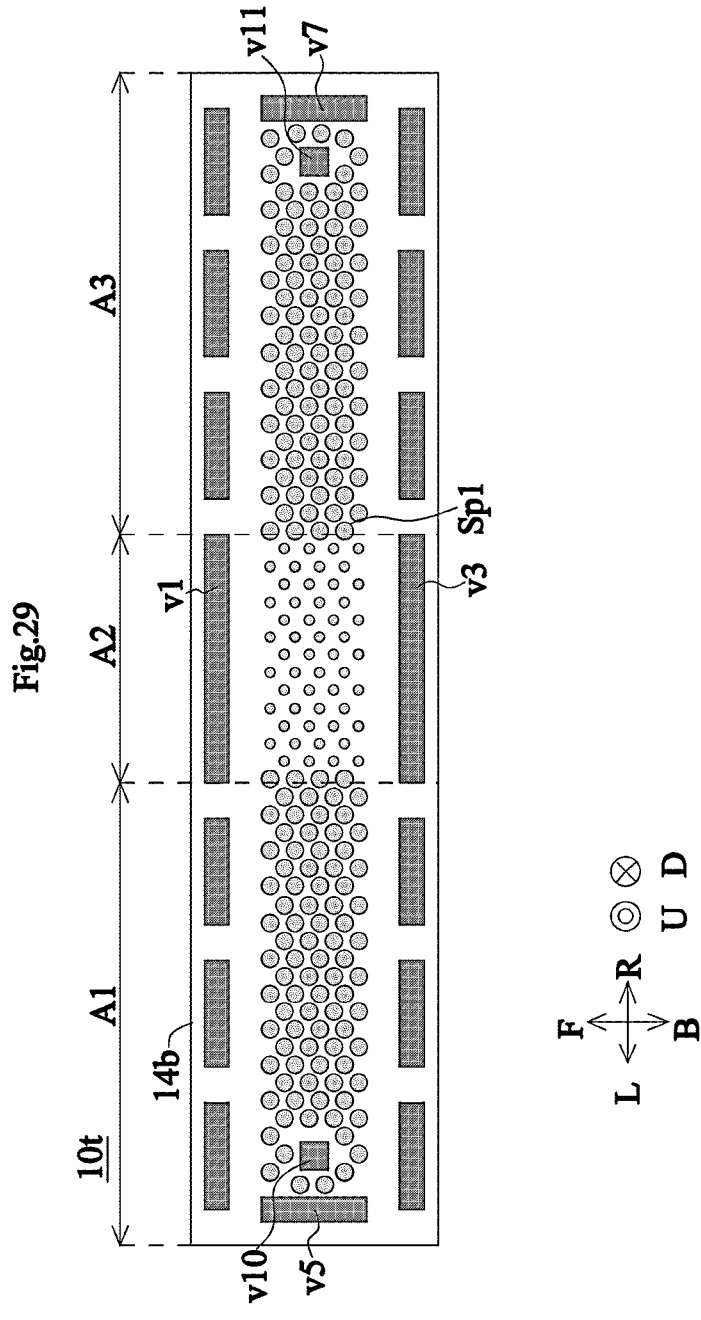
FIG. 29 is a cross-sectional view of a resin layer 14b of a multilayer substrate 10t.

Hereinafter, a multilayer substrate 10*t* according to a twentieth modification will be described with reference to the drawings. FIG. 29 is a cross-sectional view of a resin layer 14*b* of the multilayer substrate 10*t*.

The multilayer substrate 10*t* is different from the multilayer substrate 10*c* in that the shape of the plurality of hollow portions Sp1 in the first sections A1 and A3 is different from the shape of the plurality of hollow portions Sp1 in the second section A2. When viewed in the up-down direction, the diameters of the plurality of hollow portions Sp1 in the second section A2 are smaller than the diameters of the plurality of hollow portions Sp1 in the first sections A1 and A3. Since the other structure of the multilayer substrate 10*t* is the same as that of the multilayer substrate 10*c*, description thereof will be omitted. The multilayer substrate 10*t* can achieve the same effects as the multilayer substrate 10*c*.

In the multilayer substrate 10*t*, when viewed in the up-down direction, the diameters of the plurality of hollow portions Sp1 in the second section A2 are smaller than the diameters of the plurality of hollow portions Sp1 in the first sections A1 and A3. Therefore, in the multilayer substrate 10*t*, the proportion of air in the second section A2 is lower than the proportion of air in the first sections A1 and A3. Accordingly, when the second section A2 is bent, deformation of the plurality of hollow portions Sp1 is reduced or prevented.

Twenty-First Modification

Figure 30:
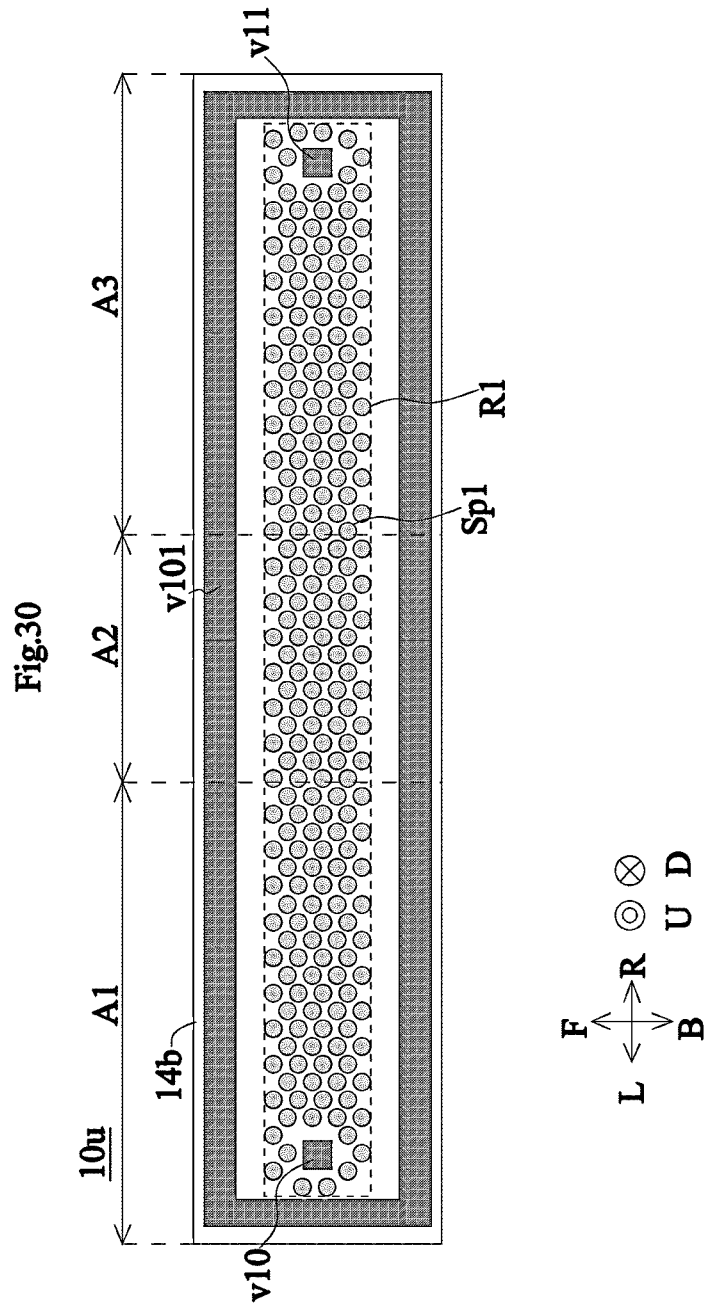
FIG. 30 is a cross-sectional view of a resin layer 14b of a multilayer substrate 10u.

Hereinafter, a multilayer substrate 10*u* according to a twenty-first modification will be described with reference to the drawings. FIG. 30 is a cross-sectional view of a resin layer 14*b* of the multilayer substrate 10*u*.

The multilayer substrate 10*u* is different from the multilayer substrate 10*c* in that a through conductor v101 is provided instead of the plurality of through conductors v1, the plurality of through conductors v3, the through conductor v5, and the through conductor v7, and that a through conductor v102 (not illustrated) is provided instead of the plurality of through conductors v2, the plurality of through conductors v4, the through conductor v6, and the through conductor v8. The through conductor v101 (first through conductor) has an annular shape surrounding the region R1 in which the plurality of hollow portions Sp1 is provided when viewed in the up-down direction (Z-axis direction). When viewed in the up-down direction (Z-axis direction), the through conductor v102 has an annular shape surrounding the region R1 in which the plurality of hollow portions Sp2 is provided. Since the other structure of the multilayer substrate 10*u* is the same as that of the multilayer substrate 10*c*, description thereof will be omitted. The multilayer substrate 10*u* can achieve the same effects as the multilayer substrate 10*c*.

In the multilayer substrate 10*u*, the through conductor v101 has an annular shape surrounding the region R1 in which the plurality of hollow portions Sp1 is provided when viewed in the up-down direction (Z-axis direction). Thus, the noise emitted from the signal conductor layer 20 is shielded by the through conductor v101. In addition, noise entering the multilayer substrate 10*u* is shielded by the through conductor v101.

Twenty-Second Modification

Figure 31:
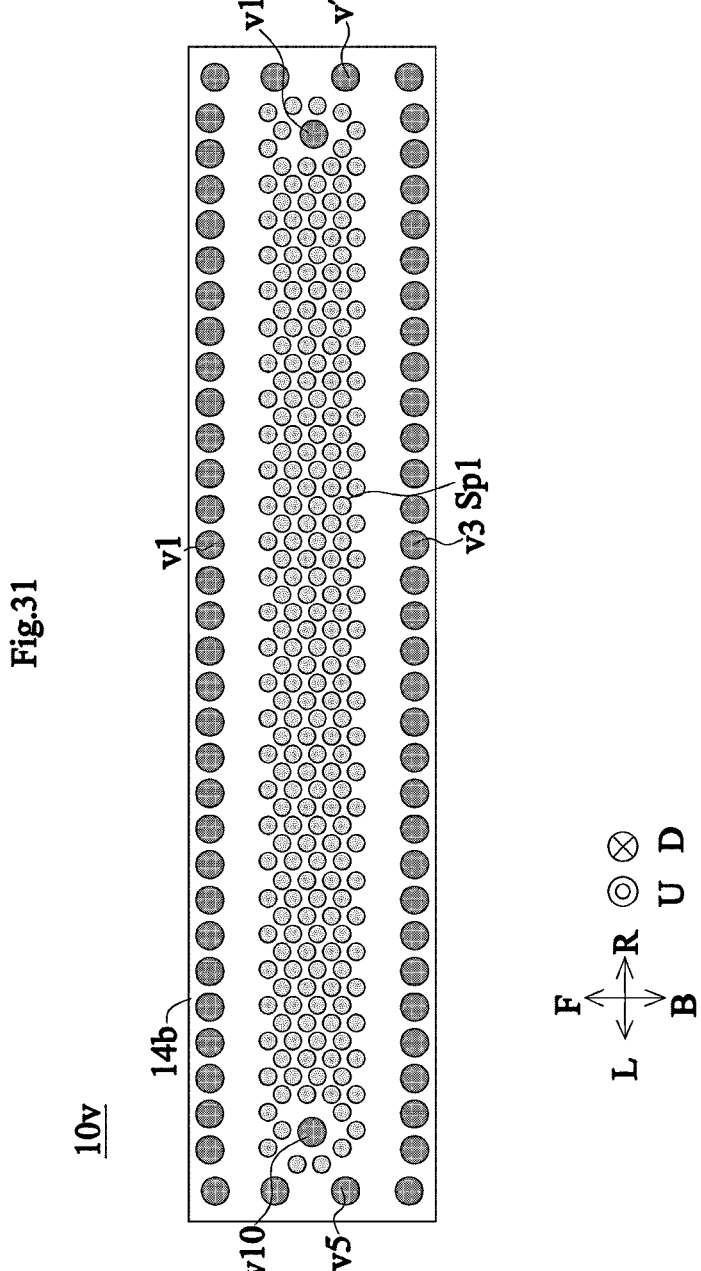
FIG. 31 is a cross-sectional view of a resin layer 14*b* of a multilayer substrate 10*v*.

Hereinafter, a multilayer substrate 10*v* according to a twenty-second modification will be described with reference to the drawings. FIG. 31 is a cross-sectional view of a resin layer 14*b* of the multilayer substrate 10*v*.

The multilayer substrate 10*v* is different from the multilayer substrate 10*c* in the structure of the plurality of through conductors v1, the plurality of through conductors v2, the plurality of through conductors v3, the plurality of through conductors v4, the through conductor v5, the through conductor v6, the through conductor v7, the through conductor v8, the through conductor v10, and the through conductor v11. The plurality of through conductors v1, the plurality of through conductors v2, the plurality of through conductors v3, the plurality of through conductors v4, the through conductor v5, the through conductor v6, the through conductor v7, the through conductor v8, the through conductor v10, and the through conductor v11 have a circular shape when viewed in the up-down direction. As a result, through-holes for forming the plurality of through conductors v1, the plurality of through conductors v2, the plurality of through conductors v3, the plurality of through conductors v4, the through conductor v5, the through conductor v6, the through conductor v7, the through conductor v8, the through conductor v10, and the through conductor v11 can be formed by a drill. Since the other structure of the multilayer substrate 10v is the same as that of the multilayer substrate 10c, description thereof will be omitted. The multilayer substrate 10v can achieve the same effects as the multilayer substrate 10c.

Electronic Device

Figure 32:
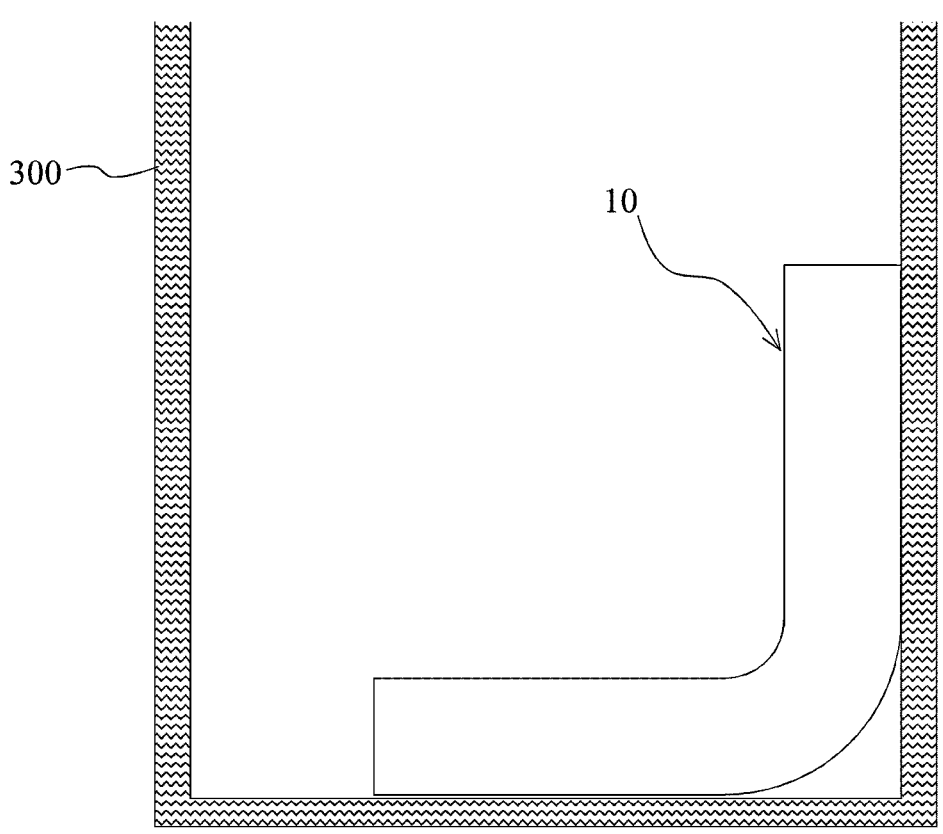
FIG. 32 is a cross-sectional view of an electronic device 1.

Hereinafter, an electronic device 1 will be described with reference to the drawings. FIG. 32 is a cross-sectional view of the electronic device 1.

The electronic device 1 is, for example, a wireless communication terminal such as a smartphone. The electronic device 1 includes the multilayer substrate 10 and a housing 300. The housing 300 accommodates the multilayer substrate 10. A material of the housing 300 may be a metal, resin, or glass. Note that the electronic device 1 may include the multilayer substrates 10a to 10v.

Other Preferred Embodiments

The multilayer substrates 10 and 10a to 10v can be changed within the scope of the gist thereof. The structures of the multilayer substrates 10 and 10a to 10v may be arbitrarily combined.

Figure 33:
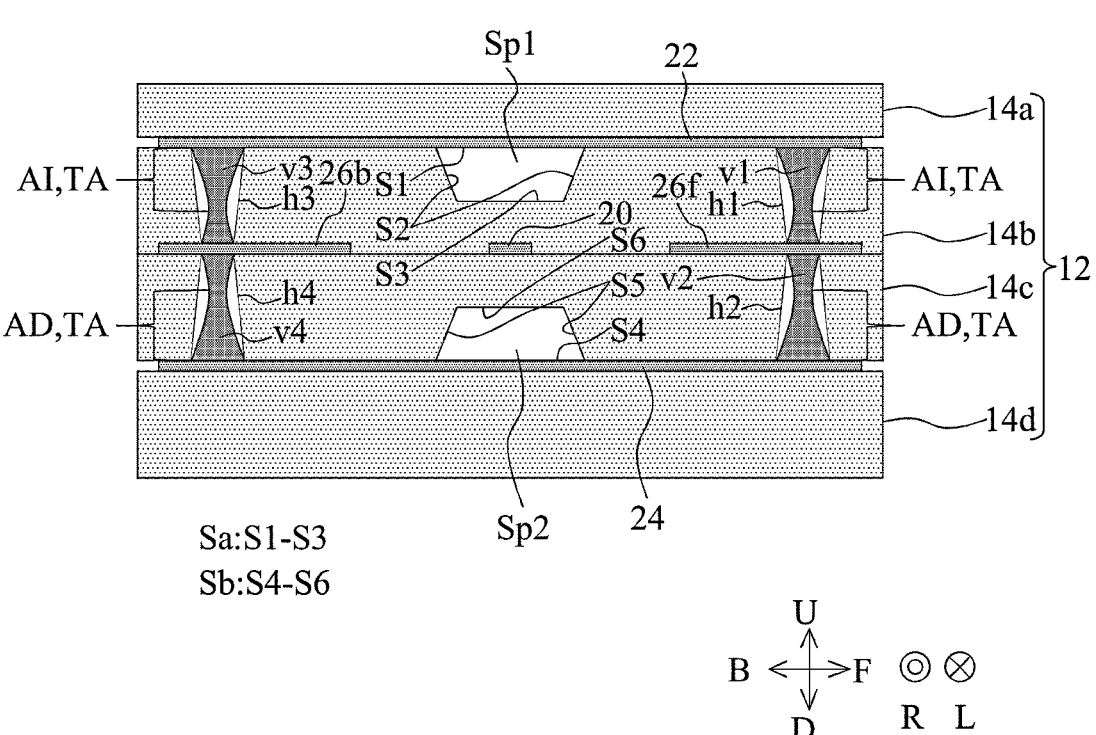
FIG. 33 is a cross-sectional view of the multilayer substrate 10 including a plurality of through conductors v1, a plurality of through conductors v2, a plurality of through conductors v3, and a plurality of through conductors v4 according to a modification.

Note that the structures of the plurality of through conductors v1, the plurality of through conductors v2, the plurality of through conductors v3, and the plurality of through conductors v4 are not limited to the structure illustrated in FIG. 2. Hereinafter, a modification of the plurality of through conductors v1, the plurality of through conductors v2, the plurality of through conductors v3, and the plurality of through conductors v4 will be described with reference to the drawings. FIG. 33 is a cross-sectional view of the multilayer substrate 10 including the plurality of through conductors v1, the plurality of through conductors v2, the plurality of through conductors v3, and the plurality of through conductors v4 according to the modification.

The plurality of through conductors v1 and the plurality of through conductors v3 are respectively located in through-holes h1 and h3 passing through the resin layer 14b in the up-down direction (Z-axis direction). A cross-sectional area of at least one of the plurality of through-holes h1 and h3 orthogonal to the up-down direction (Z-axis direction) increases toward the upward direction (the positive direction of the Z axis). The length of the increase section AI in the up-down direction (Z-axis direction) is equal to or greater than half the length of the through conductors v1 and v3 in the up-down direction (Z-axis direction). In other words, the length of the tapered region TA of the through conductor v1 in the up-down direction (Z-axis direction) is equal to or greater than half the length of the through conductor v1 in the up-down direction (Z-axis direction). In addition, the length of the tapered region TA of the through conductor v3 in the up-down direction (Z-axis direction) is equal to or greater than half the length of the through conductor v3 in the up-down direction (Z-axis direction). However, in the section below the increase section AI, the cross-sectional areas of the through conductor v1 and the through conductor v3 orthogonal to the up-down direction decrease toward the upward direction. Thus, there is a clearance between the through conductor v1 and an inner peripheral surface of the through-hole h1. There is a clearance between the through conductor v3 and an inner peripheral surface of the through-hole h3. Note that at least one of the plurality of through conductors v1 may have the above-described structure. At least one of the plurality of through conductors v3 may have the above-described structure.

The plurality of through conductors v2 and the plurality of through conductors v4 are respectively located in through-holes h2 and h4 passing through the resin layer 14c in the up-down direction (Z-axis direction). A cross-sectional area of at least one of the plurality of through-holes h2 and h4 orthogonal to the up-down direction (Z-axis direction) decreases toward the upward direction (the positive direction of the Z axis). The length of the decrease section AD in the up-down direction (Z-axis direction) is equal to or greater than half the length of the through conductors v2 and v4 in the up-down direction (Z-axis direction). In other words, the length of the tapered region TA of the through conductor v2 in the up-down direction (Z-axis direction) is equal to or greater than half the length of the through conductor v2 in the up-down direction (Z-axis direction). In addition, the length of the tapered region TA of the through conductor v4 in the up-down direction (Z-axis direction) is equal to or greater than half the length of the through conductor v4 in the up-down direction (Z-axis direction). However, in the section above the decrease section AD, the cross-sectional areas of the through conductor v2 and the through conductor v4 orthogonal to the up-down direction increase toward the upward direction. Thus, there is a clearance between the through conductor v2 and an inner peripheral surface of the through-hole h2. There is a clearance between the through conductor v4 and an inner peripheral surface of the through-hole h4. Note that at least one of the plurality of through conductors v2 may have the above-described structure. At least one of the plurality of through conductors v4 may have the above-described structure.

By using solder as a material of the through conductors v1 to v4, the through conductors v1 to v4 have the structure illustrated in FIG. 33. More specifically, when the solder that is the material of the through conductors v1 to v4 is heated, the solder melts. At this time, the solder is pulled in the up-down direction by surface tension. Thus, the vicinity of the center of the through conductors v1 to v4 in the up-down direction is constricted. As a result, there is a clearance between the through conductor v1 and the inner peripheral surface of the through-hole h1. There is a clearance between the through conductor v3 and the inner peripheral surface of the through-hole h3. There is a clearance between the through conductor v2 and the inner peripheral surface of the through-hole h2. There is a clearance between the through conductor v4 and the inner peripheral surface of the through-hole h4. Due to the clearance between the through conductors v1 to v4 and the through-holes h1 to h4, the capacitance between the through conductors v1 to v4 and the signal conductor layer 20 is reduced, therefore, the line width of the signal conductor layer 20 can be increased while maintaining the characteristic impedance generated in the signal conductor layer 20. As a result, the transmission loss occurring in the signal conductor layer 20 can be reduced.

Note that the first ground conductor layer 22, the second ground conductor layer 24, and the third ground conductor layer 26 are not essential components.

Note that the number of the through conductors v1, the number of the through conductors v2, the number of the through conductors v3, and the number of the through conductors v4 may be one or more.

Note that the number of hollow portions Sp1 and the number of hollow portions Sp2 may be one or more.

Note that the signal conductor layer 20 may be provided at a position other than the lower main surface of the resin layer 14b. The signal conductor layer 20 may be located in the hollow portions Sp1 and Sp2.

Note that the period of the unevenness may be longer than about one eighth of the wavelength of the high-frequency signal transmitted through the signal conductor layer 20.

Note that the material of the resin layers 14a to 14d and a material of the resin layers 14e and 14f may be resin other than the thermoplastic resin.

Note that when the radius of curvature of the second section A2 is smaller than the radii of curvature of the first sections A1 and A3, the first sections A1 and A3 may be bent.

Note that the proportion of air in the second section A2 may be equal to or greater than the proportion of air in the first section A1.

Note that the distance P1 between the left ends of the two adjacent hollow portions Sp1 may be longer than about one eighth of the wavelength of the high-frequency signal transmitted through the signal conductor layer 20.

Note that each of the plurality of hollow portions Sp1 need not overlap any of the plurality of through conductors v1 when viewed in the front-back direction.

Note that the cross-sectional area of the hollow portion Sp1 orthogonal to the up-down direction (Z-axis direction) may decrease toward the upward direction (the positive direction of the Z axis).

Note that the cross-sectional area of the hollow portion Sp2 orthogonal to the up-down direction (Z-axis direction) may increase toward the upward direction (the positive direction of the Z axis).

Note that a protective layer may be provided on an upper main surface of the multilayer body 12. The conductor layer is not provided on an upper main surface of the protective layer. A protective layer may be provided on a lower main surface of the multilayer body 12. The conductor layer is not provided on the upper main surface of the protective layer.

Note that the high-frequency signal may be an analog signal or a digital signal.

Note that the multilayer substrates 10 and 10a to 10v may include a plurality of signal conductor layers. In this case, the plurality of signal conductor layers may be differential transmission lines. Note that the plurality of signal conductor layers may be located on the same resin layer, or may be located on different resin layers.

Note that although the multilayer substrates 10 and 10a to 10v have a strip line structure, they may have a microstrip line structure.

Note that the multilayer substrate may have a structure in which a plurality of multilayer substrates 10 and 10a to 10v is stacked in the up-down direction.

Note that the multilayer substrates 10 and 10a to 10v may further include a circuit other than the signal line having the strip line structure.

Note that the hole and the through-hole for the hollow portion Sp1 may be formed by a tool or method other than the drill. Examples of the tool or method other than the drill include a laser beam, sand blasting, etching, a 3D printer, and the like.

Note that the cross-sectional area orthogonal to the up-down direction (Z-axis direction) of at least one of the one or more hollow portions Sp1 may increase toward the upward direction (the positive direction of the Z axis). In addition, at least one of the one or more through conductors v1 and v3 may have the increase section AI.

Note that the cross-sectional area of at least one of the one or more hollow portions Sp2 orthogonal to the up-down direction (Z-axis direction) may decrease toward the upward direction (the positive direction of the Z axis). In addition, at least one of the one or more through conductors v2 and v4 may have the decrease section AD.

Note that the shape of each of the hollow portions Sp1, Sp11, Sp12, Sp1b, Sp1f, Sp2, Sp2b, Sp2f, and Sp3 is not limited to the shape shown in the preferred embodiments and the modifications. For example, at least a portion of each of the hollow portions Sp1, Sp11, Sp12, Sp1b, Sp1f, Sp2, Sp2b, Sp2f, and Sp3 may have a polygonal shape, a curved shape, or the like.

Note that shape of each of the through conductors v1 to v8, v10, v11, v21 to v24, v101, and v102 is not limited to the shape illustrated in the preferred embodiments and the modifications. For example, at least a portion of each of the through conductors v1 to v8, v10, v11, v21 to v24, v101, and v102 may have a polygonal shape, a curved shape, or the like.

Hereinafter, a method of determining a boundary among the resin layers 14a to 14f will be described. First, a case where resin layers adjacent to each other in the up-down direction (Z-axis direction) are not fused will be described. Next, a case where resin layers adjacent to each other in the up-down direction (Z-axis direction) are fused to each other will be described.

In the case where the resin layers adjacent to each other in the up-down direction (Z-axis direction) are not fused to each other, an adhesive for fixing the resin layers adjacent to each other in the up-down direction (Z-axis direction) is present between the resin layers adjacent to each other in the up-down direction (Z-axis direction). Therefore, it is possible to determine that the resin layer located above the adhesive and the resin layer located below the adhesive are different resin layers.

In the case where the resin layers adjacent to each other in the up-down direction (Z-axis direction) are fused to each other, a difference occurs in molecular orientation of the resin layer due to pressure or the like applied at the time of integration, or molecular weight reduction occurs due to oxidation or the like of the surface of the resin layer. By observing the resin layer with a fluorescent microscope or the like, it is possible to determine that a portion in which a difference in molecular orientation occurs or a portion in which molecular weight reduction occurs is a boundary between the resin layers 14a to 14f.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a multilayer body including a plurality of resin layers including a first resin layer and stacked in a Z-axis direction;
    a signal conductor layer in the multilayer body; and
    one or more through conductors passing through the first resin layer in the Z-axis direction; wherein each of the plurality of resin layers includes a first main surface and a second main surface in the Z-axis direction;

the first main surface of the first resin layer includes one or more hollow portions, the one or more hollow portions extend into the first resin layer and are not in contact with the signal conductor layer, and the one or more hollow portions overlap the signal conductor layer when viewed in the Z-axis direction;

the one or more hollow portions do not pass through the first resin layer in the Z-axis direction;

each of the one or more hollow portions and the one or more through conductors includes a tapered region in which each of a cross-sectional area of the one or more hollow portions orthogonal to the Z-axis direction and a cross-sectional area of the one or more through conductors orthogonal to the Z-axis direction increases toward the first main surface of the first resin layer in the Z-axis direction; and the tapered region of each of the one or more hollow portions and the one or more through conductors is in contact with the first main surface of the first resin layer.

2. The multilayer substrate according to claim 1, wherein the signal conductor layer is located on the second main surface of the first resin layer.

3. The multilayer substrate according to claim 1, wherein an inner peripheral surface of the one or more hollow portions includes a top surface facing in a direction from the first main surface of the first resin layer toward the second main surface of the first resin layer; and the top surface includes a portion of the second main surface of a second resin layer in contact with the first main surface of the first resin layer among the plurality of resin layers.

4. The multilayer substrate according to claim 3, wherein the one or more hollow portions are located in a direction from the second main surface of the first resin layer toward the first main surface of the first resin layer with respect to the signal conductor layer;

the inner peripheral surface of the one or more hollow portions includes a side surface extending in the Z-axis direction;

the side surface includes a portion of the first resin layer; and the side surface defines an acute angle with the top surface.

5. The multilayer substrate according to claim 4, wherein the inner peripheral surface of the one or more hollow portions includes a bottom surface facing the top surface; and a boundary between the bottom surface and the side surface includes a curved surface.

6. The multilayer substrate according to claim 4, wherein the inner peripheral surface of the one or more hollow portions includes a bottom surface facing the top surface; and the bottom surface is provided with unevenness.

7. The multilayer substrate according to claim 6, wherein a period of the unevenness is equal to or less than about one eighth of a wavelength of a high-frequency signal transmitted through the signal conductor layer.

8. The multilayer substrate according to claim 1, further comprising a ground conductor layer that is in contact with the first main surface of the first resin layer and includes a first ground conductor layer main surface and a second ground conductor layer main surface in the Z-axis direction; wherein an inner peripheral surface of the one or more hollow portions includes a top surface facing in a direction from the first main surface of the first resin layer toward the second main surface of the first resin layer; and the top surface includes a portion of the second ground conductor layer main surface of the ground conductor layer.

9. The multilayer substrate according to claim 1, wherein when viewed in the Z-axis direction, a maximum width of the hollow portion is smaller than a maximum width of the through conductor.

10. The multilayer substrate according to claim 1, wherein when viewed in the Z-axis direction, the one or more through conductors have an annular shape surrounding a region in which the one or more hollow portions are located.

11. The multilayer substrate according to claim 1, wherein when viewed in the Z-axis direction, the hollow portion extending in an X-axis direction orthogonal to the Z-axis direction is located between the signal conductor layer and the one or more through conductors.

12. The multilayer substrate according to claim 1, wherein the multilayer body includes a first multilayer body main surface and a second multilayer body main surface in the Z-axis direction;

the multilayer substrate includes an outer electrode on the multilayer body and exposed from the first multilayer body main surface of the multilayer body;

the signal conductor layer is electrically connected to the outer electrode; and when viewed in the Z-axis direction, the one or more hollow portions surround a portion in which the signal conductor layer and the outer electrode overlap each other.

13. The multilayer substrate according to claim 1, wherein a material of the plurality of resin layers is a thermoplastic resin; and the plurality of resin layers adjacent to each other in the Z-axis direction is fused to each other.

14. The multilayer substrate according to claim 1, wherein the plurality of resin layers adjacent to each other in the Z-axis direction is fixed to each other by an adhesive layer.

15. The multilayer substrate according to claim 1, wherein the multilayer body includes a first section and a second section;

the second section is bent such that a radius of curvature of the second section is smaller than a radius of curvature of the first section.

16. The multilayer substrate according to claim 15, wherein a proportion of air in the second section is lower than a proportion of air in the first section.

17. The multilayer substrate according to claim 1, wherein the one or more through conductors are located in a through-hole passing through the first resin layer in the Z-axis direction; and a cross-sectional area of at least one of the one or more through-holes orthogonal to the Z-axis direction decreases or increases in a direction from the second main surface of the first resin layer toward the first main surface of the first resin layer.

18. The multilayer substrate according to claim 1, wherein the signal conductor layer extends in an X-axis direction orthogonal to the Z-axis direction;

a number of the one or more hollow portions is plural;

when viewed in the Z-axis direction, the plurality of hollow portions are positioned along the signal conductor layer;

when viewed in the Z-axis direction, a distance between ends of two adjacent hollow portions in a positive direction of the X-axis direction is equal to or less than about one eighth of a wavelength of a high-frequency signal transmitted through the signal conductor layer.

19. The multilayer substrate according to claim 1, wherein the signal conductor layer extends in an X-axis direction orthogonal to the Z-axis direction; and each of the one or more hollow portions overlaps any of the one or more through conductors when viewed in a Y-axis direction orthogonal to the X-axis direction and the Z-axis direction.

20. The multilayer substrate according to claim 1, wherein a length of the tapered region of the one or more through conductors in the Z-axis direction is equal to or greater than about one half of a length of the through conductor in the Z-axis direction.

21. An electronic device comprising:

a housing; and the multilayer substrate according to claim 1 accommodated in the housing.

* * * * *